(12) United States Patent
Takashima et al.

(10) Patent No.: US 8,574,661 B2
(45) Date of Patent: Nov. 5, 2013

(54) PROCESS FOR PRODUCING ORGANIC ELECTROLUMINESCENT ELEMENT AND ORGANIC ELECTROLUMINESCENT DISPLAY DEVICE

(75) Inventors: Yousuke Takashima, Tokyo (JP); Kiyokazu Tanahashi, Tokyo (JP); Keiichi Aoki, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 1200 days.

(21) Appl. No.: 12/066,724

(22) PCT Filed: Aug. 24, 2006

(86) PCT No.: PCT/JP2006/316566
§ 371 (c)(1),
(2), (4) Date: Mar. 13, 2008

(87) PCT Pub. No.: WO2007/034647
PCT Pub. Date: Mar. 29, 2007

(65) Prior Publication Data
US 2009/0267507 A1 Oct. 29, 2009

(30) Foreign Application Priority Data
Sep. 20, 2005 (JP) ................... 2005-271712

(51) Int. Cl.
*B05D 5/12* (2006.01)
*B05D 1/32* (2006.01)
*C23C 16/00* (2006.01)

(52) U.S. Cl.
USPC ............... 427/66; 427/69; 427/177; 427/282; 118/721

(58) Field of Classification Search
USPC ................. 427/66, 282, 69, 177; 118/721
See application file for complete search history.

(56) References Cited

U.S. PATENT DOCUMENTS

| | | | |
|---|---|---|---|
| 2,898,241 A * | 8/1959 | Charlton et al. | 427/79 |
| 2002/0000551 A1* | 1/2002 | Yamazaki et al. | 257/59 |
| 2003/0011305 A1* | 1/2003 | Himeshima et al. | 313/506 |
| 2003/0152691 A1* | 8/2003 | Baude et al. | 427/96 |
| 2005/0129841 A1* | 6/2005 | McCormick et al. | 427/66 |

FOREIGN PATENT DOCUMENTS

| | | |
|---|---|---|
| JP | 11273859 | 10/1999 |
| JP | 2001297876 | 10/2001 |
| JP | 2002075638 | 3/2002 |
| JP | 2002151254 | 5/2002 |

(Continued)

*Primary Examiner* — James Lin
(74) *Attorney, Agent, or Firm* — Lucas & Mercanti, LLP

(57) ABSTRACT

This invention provides a process for producing an organic EL element that, in forming, by a coating method, an organic EL element comprising a substrate bearing a plurality of organic EL elements each comprising at least a first electrode, one or more organic compound layers, a second electrode, and a sealing layer, can easily form an external connection terminal forming part for external connection terminal formation and can realize high production efficiency and stable performance quality. The process for producing an organic EL element is a process for producing an organic EL element comprising a substrate bearing at least one organic EL element comprising at least a first electrode (an anode layer), at least one organic compound layer, a second electrode (a cathode layer), and a sealing layer and is characterized by comprising a masking member application step of laminating a masking member having an adhesive strength of 1 N/25 mm to 10 N/25 mm onto the organic compound layer formation prohibition region on the substrate, an organic compound layer formation step of forming the organic compound layer on the substrate, and a masking member separation step of separating the masking member.

14 Claims, 8 Drawing Sheets

(56) References Cited

FOREIGN PATENT DOCUMENTS

| | | |
|---|---|---|
| JP | 2003017251 | 1/2003 |
| JP | 2004152512 | 5/2004 |
| JP | 2005158388 | 6/2005 |
| JP | 2005158824 | 6/2005 |

\* cited by examiner

PROCESS FOR PRODUCING ORGANIC ELECTROLUMINESCENT ELEMENT AND ORGANIC ELECTROLUMINESCENT DISPLAY DEVICE

TECHNICAL FIELD

The present invention relates to a producing method of an organic electroluminescent (EL) element, and particularly relates to assuring surface exposure of an external connection terminal forming portion for formation of an external connection terminal in the case of group formation of plural elements on a large-area substrate for multi-plane preparation.

BACKGROUND

In recent years, application of an organic electroluminescent (EL) element as a display such as a flat display and as a light source in such as an electrophotographic copier and a printer has been studied. The organic EL element is constituted by providing an anode comprising a transparent conductive layer of such as ITO (indium tin oxide) on a transparent substrate such as a glass substrate, and by providing thereon an organic layer comprising a positive hole transport layer and an emission layer, and a cathode layer comprising such as aluminum having been deposited in a stripe form crossing to the anode in this order; on the circumference of a pixel part, in which organic EL elements are arranged in a matrix form, formed are an anode side pickup electrode and a cathode side pickup electrode for connecting the anode and the cathode to an outer circuit or to an internal drive circuit.

It is known that, in an organic EL element, each crossing part of an anode and a cathode makes one pixel, and emission is generated by electron-hole recombination in the organic layer when voltage is applied on each EL element to inject an electron from the cathode and a hole from the anode. An organic EL element is an electric current drive type emitting element which is comprised of a very thin layer of a fluorescent organic substance sandwiched between an anode and a cathode, and emits by flow of the electric current. Generally, an organic substance is an insulator, however, allows current injection to be driven as an organic EL element by making very thin layer thickness. Further, since an organic EL element can be driven at a voltage as low as not higher than 10 V to enables highly efficient emission, it attracts attention as a display of the future.

In particular, recently, a phosphorescent emission organic EL element, which utilizes an excited triplet, and has efficiency far exceeding that of a conventional organic EL element, which utilizes an excited singlet, has been found by S. R. Forrest et al (Appl. Phys. Lett., 75(1), 4-6 (1999)). Further, an organic EL element has realized visual sensitivity efficiency reaching 60 lm/W as reported by C. Adachi (J. Appl. Phys., 90, 5048 (2001)), and such an element is expected to be applied not only for display but also for illumination.

At present, there are a low molecular weight type and a polymer type in an organic EL material. To manufacture an EL element by employing a low molecular weight type material, evaporation under high vacuum is conducted. Since a low molecular weight material can be easily purified by sublimation to enable easy purification, utilization of a highly pure organic EL material and easy preparation of an accumulated structure, it is very excellent with respect to efficiency and lifetime. However, since vacuum evaporation is conducted under a high vacuum condition such as not higher than $10^{-4}$ Pa, the operation is complicated and the cost is high to make a low molecular weight type material not necessarily preferable with respect to manufacturing. Particularly in illumination application, manufacturing by vacuum evaporation is difficult because an element should be formed on a large area. Further, as for a phosphorescent dopant, which is utilized in such as a phosphorescent emission organic EL element, it is difficult to introduce plural dopants having a large area without unevenness by vacuum evaporation, and it cannot avoid saying that it is costly and technically difficult.

In a polymer type material contrary to a low molecular weight type material, a wet process such as extrusion coating, dip coating, inkjet and printing can be employed in the manufacturing. That is, there is an advantage of a low cost because manufacturing under atmospheric pressure is possible. Further, there are advantages of easy control of such as a dopant and bare generation of unevenness even for a large area since a solution is prepared to make thin film. This can be said a big merit with respect to a cost and a manufacturing technology in illumination application of an organic EL element.

Since an organic layer is formed all over the surface of a substrate when an organic layer such as a hole transport layer and an emission layer are coated by a coating method, a layer is formed even on the portion which will be an external electrode pickup part of an anode which have been patterned in advance. Since an organic layer is basically an insulating substance, there causes poor conduction when there is an organic layer on the electric contact point.

Therefore, in the case of preparing an organic layer such as a hole transport layer and an emission layer by a coating method, a method to prevent a layer formation on the external connection terminal forming portion for external connection terminal formation has been studied.

For example, known is a method in which an organic layer is formed by a coating method after forming a solution repelling potion between an emission part and a non-emission part, and an organic layer, which has been formed on a non-emission part outside beyond the solution repelling portion, is wiped off to be removed by a solvent, whereby an organic EL display is manufactured (for example, refer to patent document 1).

However, a method of patent document 1 has the following disadvantages. 1) Since a solution repelling portion should be formed all over the portion where an emission part is to be formed, production efficiency is expected to be much decreased in the case of forming plural organic EL elements on a substrate. Particularly, reduction of production efficiency is expected in the case of continuous manufacturing employing a substrate of a wide width band-form flexible support. 2) An unnecessary organic layer is removed by a solvent, however, it is considered to be difficult to uniformly remove an organic layer with all organic EL elements when plural organic elements are formed on a substrate, resulting in a risk of generating scattered performance. 3) Particularly, in the case of continuous manufacturing of plural organic EL elements on a wide width band-form flexible substrate, uniform removal of an organic solvent requires much time resulting in expected decrease of production efficiency.

Further, known is a method in which a harrier wall is prepared to separately form an electrode layer in the display region, and an organic layer formed other than the display region outside the barrier wall is selectively removed by dry etching after an organic emission layer material have been coated and cured within the barrier wall (for example refer to patent document 2).

However, a method of patent document 2 has the following disadvantages. 1) Since a barrier wall should be formed all over the portion where an emission part is to be formed, production efficiency is expected to be much decreased in the case of forming plural organic EL elements on a substrate. Particularly, reduction of production efficiency is expected in the case of continuous manufacturing employing a substrate of a wide width band-form flexible support. 2) An unnecessary organic layer is removed by dry etching, however, it is considered to be difficult to uniformly remove an organic layer with all organic EL elements when plural organic elements are formed on a substrate, resulting in a risk of generating scattered performance. 3) Particularly, in the case of continuous manufacturing of plural organic EL elements on a wide width band-form flexible substrate, uniform removal of an organic solvent requires much time resulting in expected decrease of production efficiency.

In this situation, desired has been research and development of a producing method of an organic EL element and an organic EL display that, in forming by a coating method, an organic EL element comprising a substrate bearing a plurality of organic EL elements each comprising at least a first electrode, one or more organic compound layers, a second electrode and a sealing layer, can easily form an external connection terminal forming portion for external connection terminal formation and realize high production efficiency and stable performance quality.

Patent Document 1: JP-A 2004-152512 (hereinafter, JP-A refers to Japanese Patent Application Publication Open to Public Inspection No.)

Patent Document 2: JP-A 2005-158388

DISCLOSURE OF THE INVENTION

Problems to be Solved by the Invention

This invention has been made in view of the above-described situation and the object is to provide a producing method of an organic EL element and an organic EL display that, in forming by a coating method, an organic EL element comprising a substrate bearing a plurality of organic EL elements each comprising at least a first electrode, one or more organic compound layers, a second electrode and a sealing layer, can easily form an external connection terminal forming portion for external connection terminal formation and realize high production efficiency and stable performance quality.

Means to Solve the Problems

The above-described object of this invention has been achieved by the following constitutions.

(1) A method of producing an organic electroluminescent element provided with at least one electroluminescent element having at least a first electrode (an anode layer), at least one organic compound layer, a second electrode layer (a cathode layer) and a sealing layer on a substrate, wherein provided are a masking member laminating step to laminate a masking member having an adhesion force of 1-10 N/25 mm on the formation prohibition region of the aforesaid organic layer, an organic compound layer forming step to form the aforesaid organic compound layer on the aforesaid substrate, and a masking member separation step.

(2) The method of producing an organic electroluminescent element described in aforesaid item (1), wherein a cutting off step is provided after the aforesaid masking member separation step.

(3) A method of producing an organic electroluminescent element provided with at least one electroluminescent element having at least a first electrode, at least one organic compound layer, a second electrode layer and a sealing layer on a substrate, wherein the formation prohibition region of the aforesaid organic compound layer is laminated with a masking member having an adhesion force of 1-10 N/25 mm after the aforesaid first electrode has been formed on the aforesaid substrate, and the aforesaid second electrode and the aforesaid sealing layer are formed after the aforesaid organic compound layer have been formed, thereafter on an entire surface of the substrate, the aforesaid masking member is separated.

(4) The method of producing an organic electroluminescent element described in aforesaid item (3), wherein the organic electroluminescent element formed on the substrate is cut off after the aforesaid masking member has been separated.

(5) A method of producing an organic electroluminescent element to produce at least one electroluminescent element in which at least a first electrode, an organic compound layer, a second electrode layer and a sealing layer are accumulated in succession on a substrate utilizing a manufacturing apparatus which enables to successively form the first electrode layer, the organic compound layer including an emission layer, the second electrode layer and the sealing layer, wherein a process to form the aforesaid organic compound layer comprises the steps of a masking member laminating step to laminate a masking member having an adhesion force of 1-10 N/25 mm on the formation prohibition region of the aforesaid organic layer on the aforesaid substrate, an organic compound layer forming step to form the aforesaid organic compound layer and a masking member separating step to separate the aforesaid masking member.

(6) The method of producing an organic electroluminescent element described in the aforesaid item (5), wherein a cutting step is provided after the aforesaid step to form a sealing layer.

(7) The method of producing an organic electroluminescent element described in any one of the aforesaid items (1)-(6), wherein the aforesaid formation prohibition region is at least an external connection terminal forming part to form an external connection terminal of the first electrode layer.

(8) The method of producing an organic electroluminescent element described in any one of the aforesaid items (1)-(7), wherein the aforesaid substrate is a band-form flexible substrate, said band-form flexible substrate having been wound on a core to make a roll form is sent out from a supplying process as a band-form flexible substrate, on which any one of the first electrode layer, the organic compound layer including an emission layer and the sealing layer have been formed, and then recovered as a roll form by being wound on a core.

(9) The method of producing an organic electroluminescent element described in any one of the aforesaid items (1)-(8), wherein the aforesaid masking member is a flexible member provided with a sealant layer on a substrate.

(10) The method of producing an organic electroluminescent element described in any one of the aforesaid items (1)-(9), wherein the aforesaid masking member is on-line wise supplied and lamination and peeling-off of said masking member are on-line wise conducted.

(11) The method of producing an organic electroluminescent element described in any one of the aforesaid items (1)-(10), wherein lamination of the aforesaid masking member is conducted using a pressing adhesion method.

(12) The method of producing an organic electroluminescent element described in any one of the aforesaid items (1)-(11), wherein the aforesaid organic compound layer contains an emission layer forming material.

(13) The method of producing an organic electroluminescent element described in aforesaid item (12), wherein an emission mechanism of the aforesaid emission layer forming material is based on phosphorescence.

(14) An organic electroluminescent display is characterized by utilizing an organic electroluminescent element produced by the method of producing an organic electroluminescent element described in any one of the aforesaid items (1)-(13).

Effects of the Invention

This invention can provide a producing method of an organic EL element and an organic EL display that, in forming by a coating method, an organic EL element comprising a substrate bearing a plurality of organic EL elements each comprising at least a first electrode, one or more organic compound layers, a second electrode, and a sealing layer, can easily form an external connection terminal forming portion for external connection terminal formation and can realize high production efficiency and stable performance quality; whereby easy mass production of an organic EL element and an organic EL display is possible.

BRIEF DESCRIPTION OF THE DRAWINGS

FIGS. (1) and (1b) are a schematic cross-sectional view to show an example of a layer constitution of an organic EL element.

DESCRIPTION OF THE SYMBOLS

Figure 1:
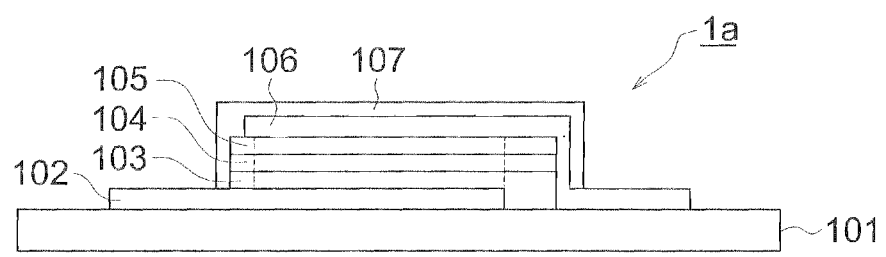
Figure 1:
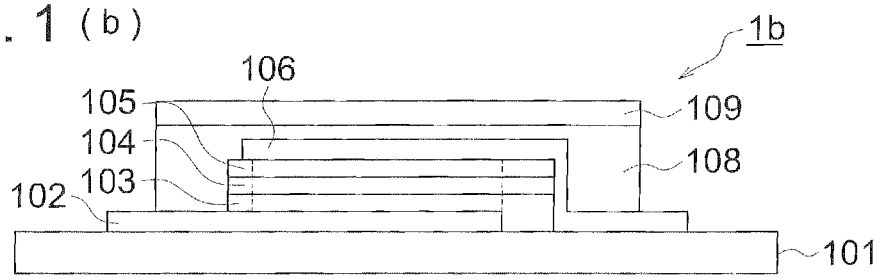

1a: organic EL element
101: substrate
102: anode layer
103: hole transport layer
104: organic compound layer (emission layer)
105: electron injection layer
106 cathode layer
107: sealing layer
108: adhesive layer
109: sealing member
2a: manufacturing apparatus
3: organic compound layer forming process
3b: masking member lamination process
3e: masking member peeling-off process
4: second electrode (cathode layer) forming process
5, 10: sealing layer forming process
502: sealing member lamination part
502a: adhesive coating part
502b: sealing member supply part
503 die-cutting part
503a: die-cutter
8, 8a-8d: masking member
11: cutting process
11a: slitter
11b: cutter

BEST MODE TO CARRY OUT THE INVENTION

An embodiment of this invention will be explained referring to FIGS. 1-8, however, this invention is not limited thereto.

FIG. 1 is a schematic cross-sectional view to show an example of a layer constitution of an organic EL element.

FIG. 1 (a) is a schematic cross-sectional view to show a layer constitution of an organic EL element which is provided with a sealing layer. FIG. 1 (b) is a schematic cross-sectional view to show a layer constitution of an organic EL element which is formed by laminating a sealing member via an adhesive.

The layer constitution of an organic EL element shown in FIG. 1 (a) will be now explained. In the drawing, 1a is an organic EL element. Organic EL element 1a is provided with anode layer 102, hole transport layer 103, organic compound layer (emission layer) 104, electron injection layer 105, cathode layer 106 and sealing layer 107, in this order on substrate 101.

The layer constitution of an organic EL element shown in FIG. 1 (b) will be now explained. In the drawing, 1a is an organic EL element. Organic EL element 1b is provided with anode layer 102, hole transport layer (hole injection layer) 103, organic compound layer (emission layer) 104, electron injection layer 105, cathode 106, adhesive layer 108 and sealing member 109, in this order on substrate 101. In an organic EL element shown in this drawing, a hole injection layer (not shown in the drawing) may be provided between anode layer 102 and hole transport layer 103. Further, an electron transport layer (not shown in the drawing) may be provided between cathode 106 and organic compound layer (emission layer) 104 and electron injection layer 105. In organic EL element 1a and organic EL element 1b, a gas barrier layer (not shown in the drawing) may be provided between anode 102 and substrate 101.

This invention relates to a forming method of organic compound layer (emission layer) 104 and organic compound layer (hole transport layer) 103; a producing method of organic EL element 1a in which electron injection layer 105, cathode 106 and sealing layer 107 are formed on formed organic compound layer (emission layer) 104 and organic compound layer (hole transport layer) 103, and organic EL element 1b in which sealing member 109 is laminated via electron injection layer 105, cathode 106 and adhesive layer 108 on formed organic compound layer (emission layer) 104; and an organic EL element prepared by these producing methods.

The layer constitution of an organic EL element of this drawing is shown as an example; however, other typical layer constitutions of an organic EL element include the following constitutions.

(1) substrate/anode/emission layer/electron transport layer/cathode/sealing layer (2) substrate/anode/hole transport layer/emission layer/hole block layer/electron transport layer/cathode/sealing layer (3) substrate/anode/hole transport layer (hole injection layer)/emission layer/hole block layer/electron transport layer/cathode buffer layer (electron injection layer)/cathode/sealing layer (4) substrate/anode/anode buffer layer (hole injection layer)/hole transport layer/emission layer/hole block layer/electron transport layer/cathode buffer layer (electron injection layer)/cathode/sealing layer Each layer constituting an organic EL element will be explained later.

Figure 2:
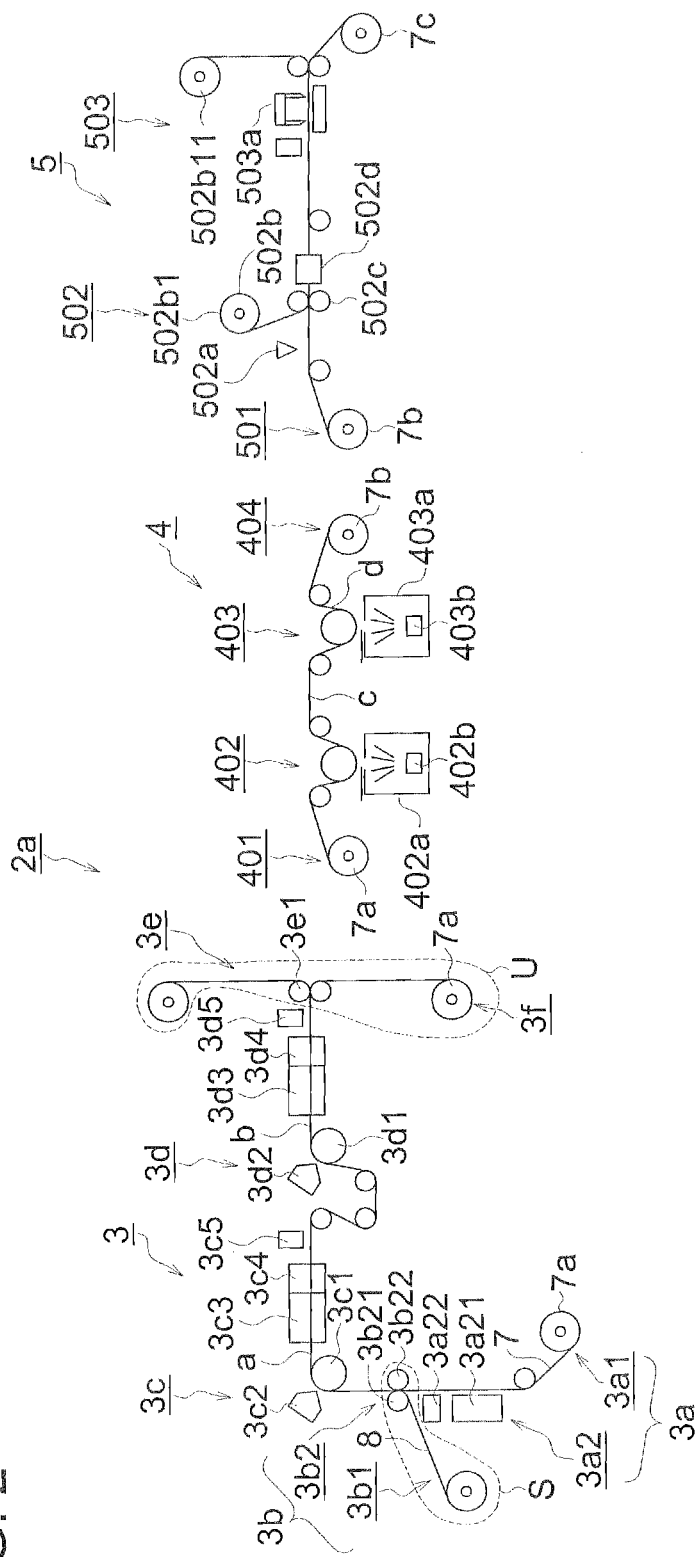
FIG. 2 is a schematic drawing to show an example of a manufacturing apparatus to prepare an organic EL element.

FIG. 2 is a scheme to show an example of a manufacturing apparatus to prepare an organic EL element. Herein, in this drawing, a gas barrier layer and a first electrode forming process is omitted because a band-form flexible support on which a gas barrier layer and a first electrode have been already formed is utilized. Explanation of the manufacturing apparatus shown in this drawing will be made for the case of an organic EL element, in which a gas barrier layer, a first electrode, a hole transport layer, an emission layer, an electron injection layer, a second electrode and a sealing layer are formed in this order on a band-form flexible support, as an example of an organic EL element.

In the drawing, 2a is a manufacturing apparatus in which an organic compound layer as one constituent layer of an organic EL element is formed by a wet coating method and a sealing layer is formed by lamination of a sealing member. Manufacturing apparatus 2a is provided with forming process 3 to form an organic compound layer, second electrode (cathode layer) forming process 4 and sealing layer forming process 5.

Forming process 3 to form an organic compound layer is provided with supply process 3a of a band-form flexible support, masking member lamination process 3b, first organic compound layer forming process (first coating-drying process) 3c, second organic compound layer forming process (second coating-drying process) 3d, masking member peeling-off process 3e and first recovery process 3f.

Supply process 3a is provided with unwinding process 3a1 and surface treatment process 3a2. In unwinding process 3a1, supplied is band-form flexible support 7, on which a gas barrier layer and an anode layer including a first electrode in this order have been already formed, having been wound on a core to make a roll state. 7a is a master roll of band-form flexible support 7. Surface treatment process 3a2 is provided with washing surface modification processor 3a21 and first antistatic means 3a22. In washing surface modification processor 3a21, the first electrode (not shown in the drawing) surface of band-form flexible support 7 is washing modified before an organic compound layer forming coating solution (a hole transport layer forming coating solution) is coated, and first antistatic means 3a22 is provided with a non-contact type charge neutralizer and a contact type charge neutralizer. Since charge neutralization of a substrate is promoted by the first antistatic means to prevent dust adhesion and dielectric breakdown at the time of coating of all organic compound layer forming coating solution (a hole transport layer forming coating solution), yield of the element will be improved.

Masking member lamination process 3b is arranged to laminate a masking member on the formation prohibition region of an organic compound layer of band-form flexible support 7 on which a first electrode (not shown in the drawing) has been formed, and enables easy formation of an organic compound layer on band-form flexible support 7 by lamination of a masking member. Masking member lamination process 3b will be detailed in FIG. 4.

First organic compound layer forming process (first coating-drying process) 3c is provided with backup roll 3c1 to hold band-form flexible support 7, first wet coater 3c2 to coat a hole transport layer forming coating solution on band-form flexible support 7 held by backup roll 3c1, first dryer 3c3 to remove a solvent of a hole transport layer having been formed on a first electrode (not shown in the drawing) on band-form flexible support 7, first heater 3c4 to heat hole transport layer a from which a solvent has been removed, and second antistatic means 3c5. A hole transport layer forming coating solution from first wet coater 3c2 is coated all over the surface of band-form flexible support 7 including on a masking member having been laminated on band-form flexible support 7.

Second organic compound layer forming process (second coating-drying process) 3d is provided with backup roll 3d1 to hold band-form flexible support 7, second wet coater 3d2 to coat an emission layer forming coating solution on band-form flexible support 7 held by backup roll 3d1, second dryer 3d3 to remove a solvent of emission layer b having been formed on hole transport layer a on band-form flexible support 7, second heater 3d4 to heat emission layer b from which a solvent has been removed, and third antistatic means 3d5. An emission layer forming coating solution from second wet coater 3d2 is coated all over the surface of hole transport layer a on band-form flexible support 7. Second antistatic means 3c5 and third antistatic means 3d5 preferably have the same constitution as first antistatic means 3a22.

Masking member peeling-off process 3e is provided with peeling roll 3e1 and is able to recover masking member 8, having been laminated on band-form flexible support 7, by being peeled off. Masking member peeling off process 3e will be detailed in FIG. 5.

In first recovery process 3f, band-form flexible support 7 (in a state of bearing a gas barrier layer, a first electrode layer, a hole transport layer and an emission layer formed in this order) is wound up and recovered as a roll-form 7a of a band-form flexible support in a state of masking member 8 having been peeled off in masking member peeling-off process 3e.

Second electrode (cathode layer) forming process 4 is provided with supply process 401, electron injection layer forming process 402, second electrode forming process 403, and second recovery process 404. In supply process 401, band-form flexible support 7a which has been prepared in the previous process is unwound to be supplied to electron injection layer forming process 402. In electron injection layer forming process 402, electron injection layer c is formed on emission layer b. Herein, to form electron injection layer c, evaporation is conducted via a mask not to deposit an electron injection layer on the external pick-up terminal forming portion of a first electrode. 402a is an evaporation system and 402b is evaporation source container. Band-form flexible support 7 on which electron injection layer c has been formed is successively sent to second electrode forming process 403.

In second electrode forming process 403, second electrode d is formed on electron injection layer c having been formed in electron injection layer forming process 402 in a state of intersecting at a right angle against a first electrode. Herein, to form second electrode d, evaporation is conducted via a mask not to deposit the component to form a second electrode on the external pick-up terminal forming portion of a first electrode. 403a is an evaporation system and 403b is evaporation source container. A band-form flexible support, on which second electrode d has been formed, is wound in the second recovery process and recovered as rolled band-form flexible support 7b to be sent to sealing layer forming process 5 as the next process. In this stage, a gas barrier layer, a first electrode, a hole transport layer, an emission layer, an electron injection layer, a second electrode have been formed in this order on flexible support 7.

Sealing layer forming process 5 is provided with band-form flexible support supply process 501 of band-form flexible support 7b which bears layers up to a second electrode, sealing member lamination process 502 and die-cutting process 503. In band-form flexible support supplying process 501, band-form flexible support 7b having been prepared in the previous process is unwound and supplied to sealing member lamination process 502. Sealing member lamination process 502 is provided with adhesive coating process 502a, which coats an adhesive on an emission region or the circumference of the emission region on band-form flexible support 7b, and sealing member supplying process 502b. After an adhesive has been coated in adhesive coating process 502a, sealing member 502b1 is accumulated on the whole width of band-form flexible support 7b and laminated on band-form flexible support 7b through pressing roll 502c to be subjected to a curing treatment in lamination process 502d. After having been subjected to a curing treatment, the product support is sent to die-cutting process 503 to conduct removal of the excess sealing member by die-cutter 503a. At this stage, rolled band-form flexible support 7c which continuously bears plural organic EL elements, in which a gas barrier layer, a first electrode, a hole transport layer, an emission layer, an electron injection layer, a second electrode and a sealing layer have been formed in this order on a flexible support, is recovered 502b11 is an unnecessary potion (residue after die-cut) of a sealing member from which a portion laminated on a band-form flexible support has been removed, and is wound up and removed. Band-form flexible support 7c recovered is cut into independent organic EL elements in cutting process 11 shown in FIG. 3. Herein, die-cutting process 503 will be explained in FIG. 6

A method to coat an adhesive is not specifically limited and includes methods, such as a spray method, an extrusion nozzle method, a silk method, which are generally employed for coating of an adhesive. An adhesive according to this invention includes a photo-curing and a heat-curing type sealants having a reactive vinyl group such as acrylic acid type oligomer and methacrylic acid type oligomer, and a moisture-curing sealant such as 2-cyanoacrylic ester, a heat- and chemical-curing type (two solution mixing) sealant such as an epoxy type, and an ultraviolet-curing type epoxy resin sealant of a cationic curing type. It is preferable to appropriately incorporated filler in a liquid type sealant.

Figure 3:
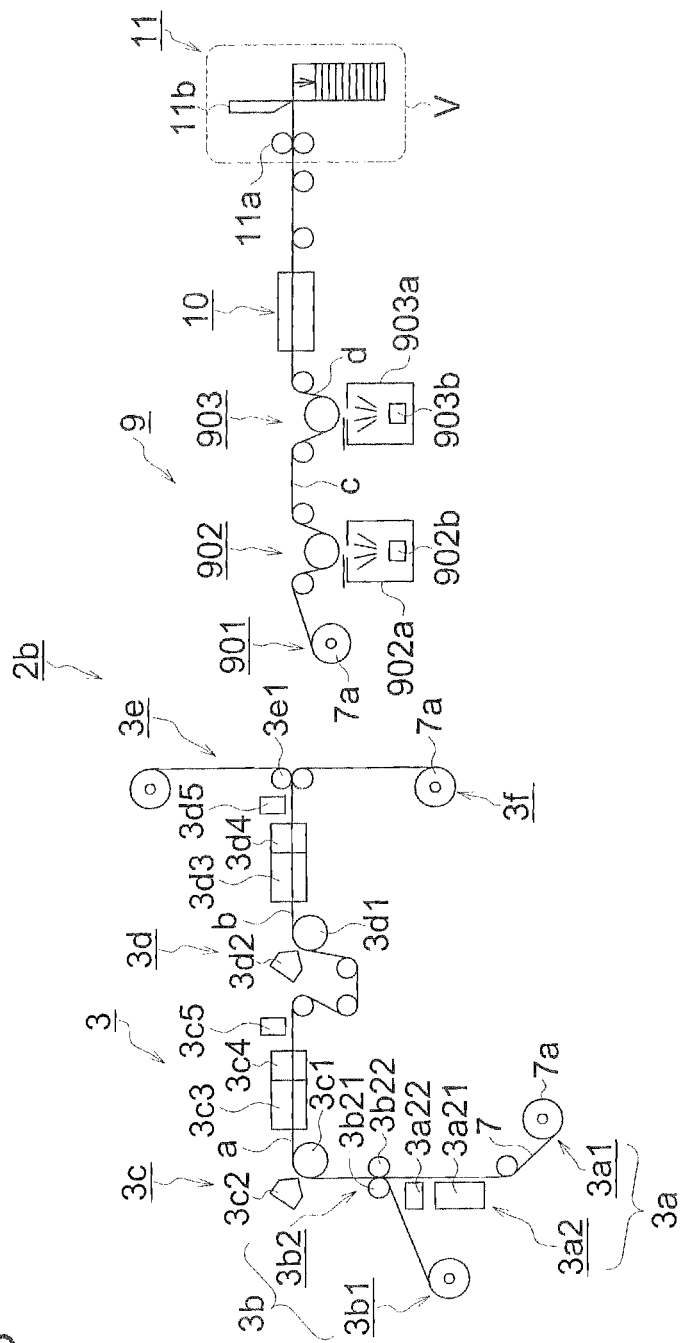
FIG. 3 is a scheme to show another example of a process to prepare an organic EL element.

FIG. 3 is a scheme to show another example of a process to prepare an organic EL element. Herein, since forming process 3 to form an organic compound layer shown in this drawing is identical with an organic compound layer forming process having been shown in FIG. 2, the explanation will be omitted.

In the drawing, 2b is a manufacturing apparatus to prepare an organic EL element. Manufacturing apparatus 2b is provided with forming process 3 to form an organic compound layer (identical with forming process 3 to form an organic compound layer, which is shown in FIG. 2), second electrode (cathode layer) forming process 9, sealing layer forming process 10 and cutting process 11.

Second electrode (cathode layer) forming process 9 is provided with supply process 901, electron injection layer forming process 902, and second electrode forming process 903. In supply process 901, band-form flexible support 7a which has been prepared in the previous process is unwound to be supplied to electron injection layer forming process 902. In electron injection layer forming process 902, electron injection layer c is formed on emission layer b. Herein, to form electron injection layer c, evaporation is conducted via a mask not to deposit an electron injection layer on the external pick-up terminal forming portion of a first electrode. 902a is an evaporation system and 402b is evaporation source container. Band-form flexible support 7 on which electron injection layer c has been formed is successively sent to second electrode forming process 903.

In second electrode forming process 903, second, electrode d is formed on electron injection layer c having been formed in electron injection layer forming process 902 in a state of intersecting at a right angle against a first electrode. Herein, to form second electrode d, evaporation is conducted via a mask not to deposit the component to form a second electrode on the external pick-up terminal forming portion of a first electrode. 903a is an evaporation system and 903b is evaporation source container. A band-form flexible support, on which second electrode d has been formed, is successively sent to sealing layer forming process 10 as the next process.

In sealing layer form in a process 10, a sealing layer is formed on a second electrode except the external connection terminal forming portion for formation of the external connection terminal of the formed second electrode. At this stage, prepared is an organic EL element in a state of plural organic EL elements, in which a gas barrier layer, a first electrode, a hole transport layer, an emission layer, an electron injection layer, a second electrode and a sealing layer formed in this order on flexible support 7, being continuously formed. After a sealing layer has been formed, flexible support 7 on which plural organic EL elements have been formed is successively sent to cutting process 11 to individually separate said plural elements.

Cutting process 11 is provided with slitter 11a having an over blade and an under blade and cutter 11b, and individually separates plural organic EL elements having been formed on band-form flexible support 7 into individual element, whereby preparation of an organic EL element shown in FIG. 1 (a) is finished. Cutting process 11 will be explained in FIG. 8. Other symbols are identical with those in FIG. 2.

As a washing surface modification treatment which is utilized in an organic compound layer forming process of a manufacturing apparatus to prepare organic EL element shown in FIGS. 2 and 3, specifically, such as a low-pressure mercury lamp, an excimer lamp and a plasma washing device are preferably utilized. A condition of a washing surface modification treatment by a low-pressure mercury lamp includes such as a condition in which a washing surface modification treatment is conducted by irradiation with a low-pressure mercury lamp having a wavelength of 184.2 nm at irradiation strength of 5-20 mW/cm$^2$ and at a distance of 5-15 mm. As a condition of a washing surface modification treatment by a plasma washing system, for example, atmospheric pressure plasma is preferably employed. The washing condition includes one in which a washing surface modification treatment is conducted utilizing an argon gas at a frequency of 100 kHz-150 MHz, a voltage of 10 V-10 kV and a distance of 5-20 mm.

A non-contact type antistatic system employed as an antistatic means utilized in a manufacturing apparatus to prepare an organic EL element, which is shown in FIGS. 2 and 3, includes, for example, a non-contact type ionizer; the types of an ionizer is not specifically limited and an ion generation method may be either an AC method and a DC method. An AC type, a double DC type, a pulse AC type and a soft X ray type can be utilized; however, an AC type is preferred particularly with respect to precise charge neutralization. As an ejection gas required in the case of employing an AC type, air or $N_2$ is utilized, however, sufficiently purified $N_2$ is preferably utilized. Further, a blower type or a gun type is preferably selected with respect to an in-line processing.

Further, as a contact type antistatic system, a charge neutralizing roll or a grounded conductive brush is employed. A charge neutralizing roll as a charge neutralizer is grounded and the surface charge is neutralized by contact with the surface where charge is neutralized while rotating freely. As such a charge neutralizing roll, a elastic roll made of plastics or rubber which has been blended with carbon black, metal powder and metal fiber, in addition to a roll made of metal such as aluminum, copper, nickel and stainless, are utilized. Particularly, to promote good contact with a band-form flexible continuous sheet, those having elasticity are preferable. A grounded conductive brush generally includes a brush member comprising linearly oriented conductive fiber, a charge neutralizing bar or those having a charge neutralizing strings structure which is provided with a linear brush made of metal. A charge neutralizing bar is not specifically limited; however, a corona discharge type such as SJ-B manufactured by Keyence Corp. is preferably utilized. A charge neutralizing string also is not specifically limited; however, generally, a flexible string-form is preferably utilized.

A non-contact type antistatic system is preferably utilized on a first electrode surface side of a band-form flexible support and a contact type antistatic system is preferably utilized on the rear surface side of a band-form flexible support.

Figure 4:
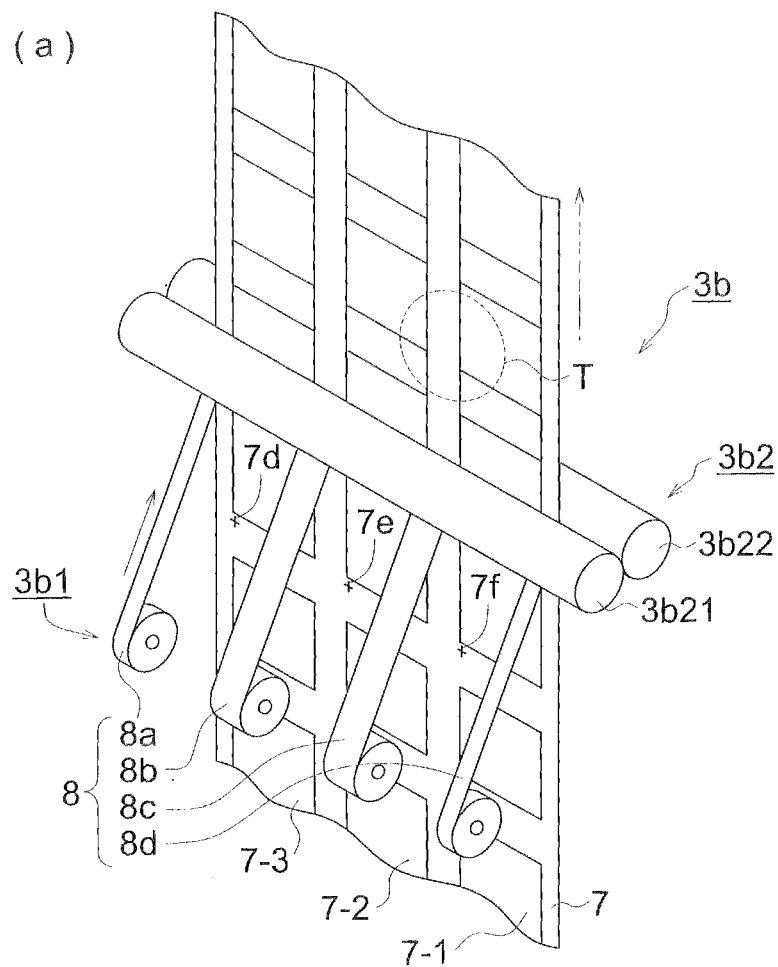
FIG. 4(a) is a magnified schematic oblique view of a portion represented by S in FIG. 2.
FIG. 4(b) is a magnified schematic drawing of a portion represented by T in FIG. 4(a).
Figure 4:
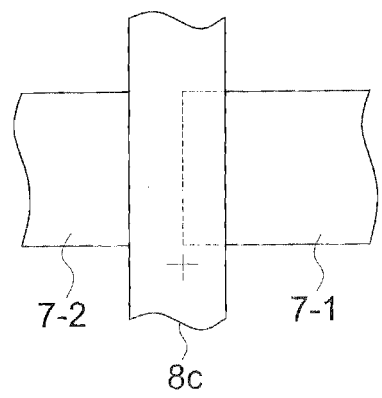

FIG. 4 is a magnified schematic drawing of a portion represented by S in FIG. 2. FIG. 4 (*a*) is a magnified schematic oblique view of a masking member lamination process represented by S in FIG. 2. FIG. 4 (*b*) is a magnified schematic plane figure of a potion represented by T in FIG. 4 (*a*).

In the drawing, 7-1-7-3 are each line of a first electrode formed on band-form flexible support 7. 3*b* is a masking member lamination process. Masking member lamination process 3*b* is provided with masking member supply process 3*b*1 to supply masking member 8 in a state of a roll form being wound on a core, and a pressing process 3*b*2 provided with pressing roll 3*b*21 and receiving roll 3*b*22 to laminate a masking member on the formation prohibition region of an organic compound layer. The pressure (plane pressure) to press band-form flexible support 7 between press roll 3*b*21 and receiving roll 3*b*22 in pressing process 3*b*2 is preferably 0.01 MPa-0.5 MPa, in consideration of such as film strength of a transparent conductive layer which forms a first electrode (an anode layer). The adhesive strength of a masking member utilized is 1-10 N/25 mm and is specifically preferably 3-8 N/25 mm. Herein adhesive strength is represented by a value measured based on JIS Z-0237 Adhesive Tape-Adhesive Sheet Test Method.

In the case of adhesive strength of less than 1 N/25 mm, a masking member may be peeled off during an organic compound layer being coated resulting in a risk that an organic compound layer forming coating solution may be coated on a region where formation of an organic compound layer is inhibited; which is not preferable. In the case of adhesion force of over 10 N/25 mm, it is not preferable because of a risk that an organic layer on an effective pixel electrode may be peeled off at the time of peeling-off of a masking member.

A masking member is not specifically limited and includes, for example, 1) a masking member provided with an adhesive on a substrate and the back surface thereof, 2) a masking member provided with a sealant layer on a substrate and the back surface thereof, and 3) independent thermoplastic resin film. A substrate is not specifically limited and thermoplastic resin film applied for ordinary packaging such as paper, polytetrafluoroethylene (PTFE), ethylene tetrafluoroethylene copolymer (ETFE), high density polyethylene (HDPE), oriented propylene (OPP), polystyrene (PS), polymethylmethacrylate (PMMA), oriented nylon (ONy), polyethylene terephthalate (PET), polycarbonate (PC), polyimide and polyether sulfone (PES) can be utilized. Further, these thermoplastic resin films can be naturally utilized as multi-layer film prepared by co-extrusion appropriately with different type film and multi-layer film prepared by laminating said films varying the orientation angle. Further, to achieve required physical properties, it is naturally possible to prepare film by combining films having different density and molecular weight distribution.

An adhesive is not specifically limited and such as an acryl type, a silicone type and a rubber type can be utilized; it can be appropriately selected according a solvent of a coating solution employed in an organic compound layer (hole transport layer, emission layer) forming coating solution which is coated on a masking member.

As a sealant layer, thermoplastic resin film having a melt flow rate defined by JIS K 7210 of 5-20 g/10 min is preferably utilized, and thermoplastic resin film having a melt flow rate of 6-15 g/10 min is more preferably utilized. Thermoplastic resin film is not specifically limited provided satisfying the above-described values, however, utilized can be polymer film described in "New Development of Functional Packaging Materials" (Toray Research Center) such as low density polyethylene (LDPE), HDPE, linear low density polyethylene (LLDPE), medium density polyethylene, non-oriented polypropylene, OPP, ONy, PET, cellophane, polyvinyl alcohol (PVA), oriented vinylon (OV), ethylene-vinyl acetate copolymer (EVOH), ethylene-propylene copolymer, ethylene-acrylic acid copolymer, ethylene-methacrylic acid copolymer and vinylidene chloride (PVDC). Among these thermoplastic resin films, it is specifically preferable to utilize LDPE, LLDPE; LDPE and LLDPE manufactured by use of a metallocene catalyst; and film prepared by mixing these films with HDPE film.

Thermoplastic resin film in the case of utilizing thermoplastic resin film alone includes thermoplastic resin film employed for a sealant layer.

This drawing shows the case of utilizing four masking members 8*a*-8*d*. In this drawing, a region, where formation of an organic compound layer is inhibited, of band-form flexible support 7 corresponds to the edge portion of a first electrode of 7-3 row and the left edge of band-form flexible support 7, the portion between 7-2 row and 7-3 row including the edge portion of 7-2 row and 7-3 row, the portion between 7-1 row and 7-2 row including the edge portion of 7-1 row, the edge of a first electrode of 7-1 row and the right edge of band-form flexible support 7.

Into masking member lamination process 3*b*, band-form flexible support 7, on which a first electrode has been formed in three rows, is supplied.

Each masking member 8*a*-8*d* is arranged in masking member supply process 3*b*1 corresponding to each row 7-1-7-3 of a first electrode having been formed on band-form flexible support 7, and is unwound at the same speed as the conveying speed of band-form flexible support 7 to enable a masking member being laminated on a region, where formation of an organic compound layer is inhibited, of band-form flexible support 7. In this drawing, shown is a state, in which each masking member is continuously laminated at a speed matching to the conveying speed of band-form flexible support 7 in the following manner: masking member 8*a* on the edge portion of a first electrode and the left edge portion of band-form flexible support 7, masking member 8*b* between 7-2 row and 7-3 row including the edge portion of 7-2 row, masking member 8c between 7-1 row and 7-2 row including the edge portion of 7-1 row, masking member 8d on the edge portion of a first electrode and the right edge portion of band-form flexible support 7. The edge portion of a first electrode of each row, which is covered by a masking member, is the portion finally to be an external pickup terminal.

7d is an alignment mark attached to each block of a first electrode in 7-1 row. 7e is an alignment mark attached to each block of a first electrode in 7-2 row. 7f is an alignment mark attached to each block of a first electrode in 7-3 row. These alignment marks 7d-7f attached to each block of a first electrode is utilized for alignment at the time of cutting organic EL elements into individual elements, after organic EL elements are prepared on band-form flexible support on which a sealing layer has been formed.

Figure 5:
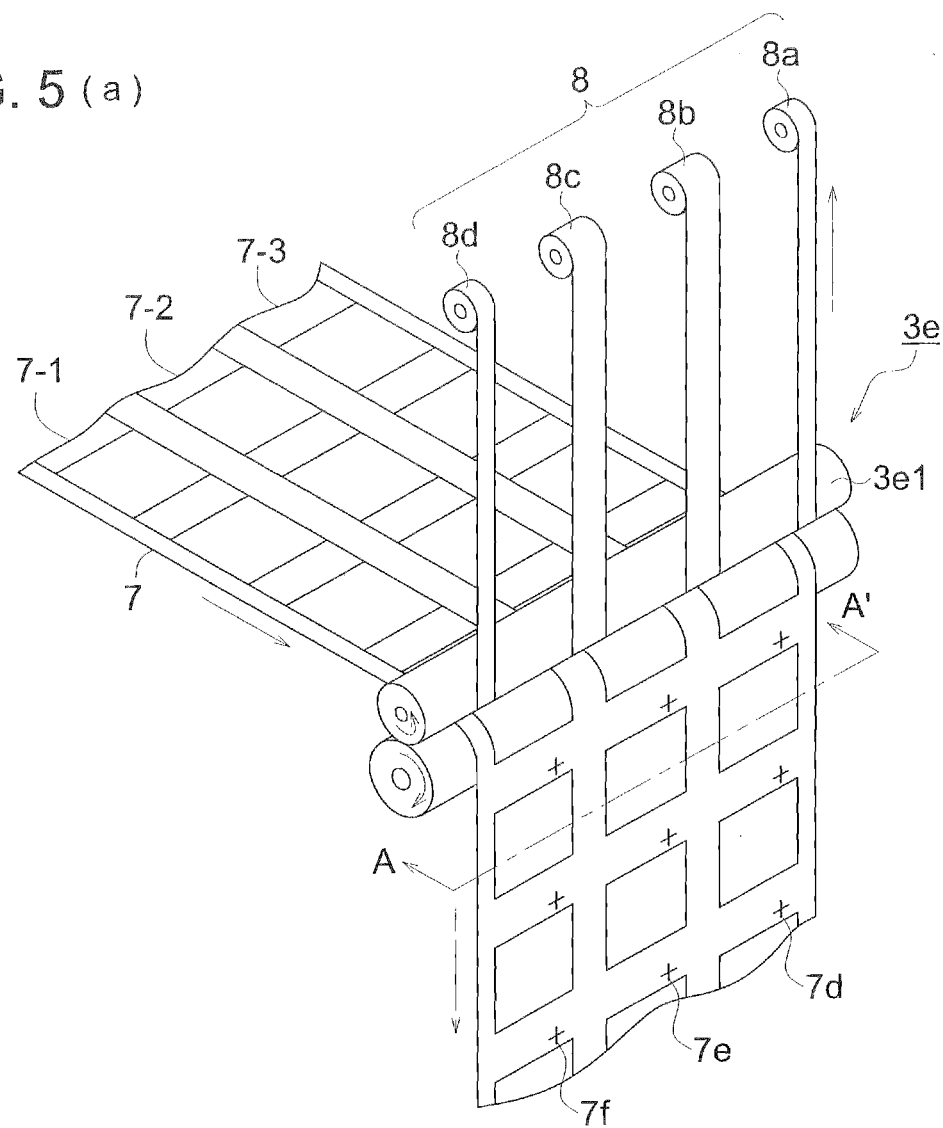
FIG. 5(a) is a magnified schematic oblique view of a portion represented by U in FIG. 2.
FIG. 5(b) is a schematic cross-sectional view taken along line A-A' of FIG. 5(a).
Figure 5:
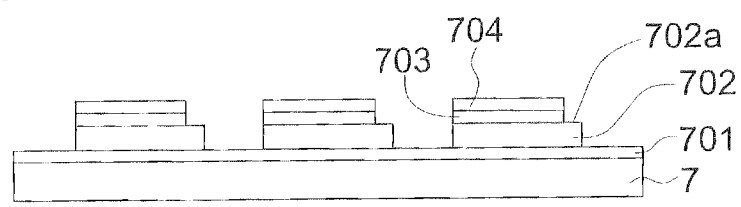

FIG. 5 is a magnified schematic drawing of a portion represented by U in FIG. 2. FIG. 5 (a) is a magnified schematic oblique view of a masking member peel-off process represented by U in FIG. 2. FIG. 5 (b) is a schematic cross-sectional view along A-A' of FIG. 5.

Masking member peel-off process 3e is a process to peel off each masking member 8a-8d, which is laminated on a formation forbidden region of an organic compound layer, from band-form flexible support 7, on the whole surface of which including each masking member 8a-8d, up to a hole transport layer and an emission layer have been successively formed. A state of a masking member having been peeled off will be explained referring to FIG. 5 (b) 701 is gas barrier film; 702 is a first electrode; 703 is a hole transport layer; and 704 is an emission layer. 702a is the edge portion of a first electrode which is exposed by peeling-off of a masking member having been laminated on the edge portion of a first electrode as a formation forbidden region of an organic compound layer, and becomes an external connection terminal forming portion finally to form an external connection terminal. Other symbols are identical with those in FIGS. 2 and 4.

Figure 6:
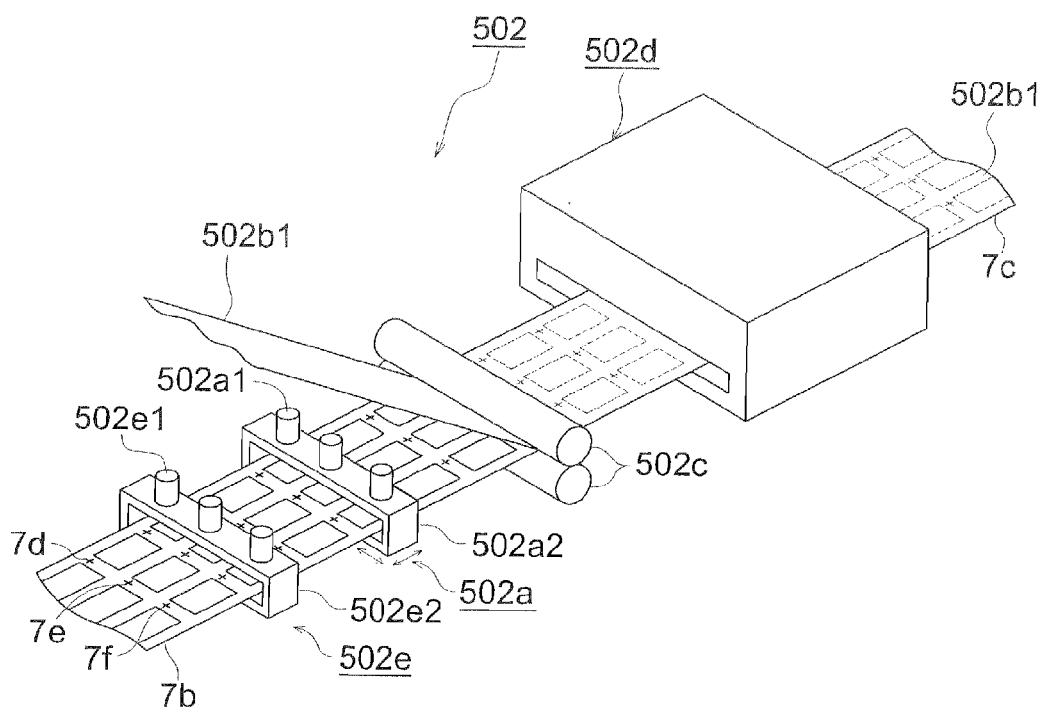
FIG. 6(a) is a magnified schematic oblique view of a sealing member lamination part shown in FIG. 2.
FIG. 6(b) is a magnified schematic side view of a sealing member lamination part shown in FIG. 6(a).
Figure 6:
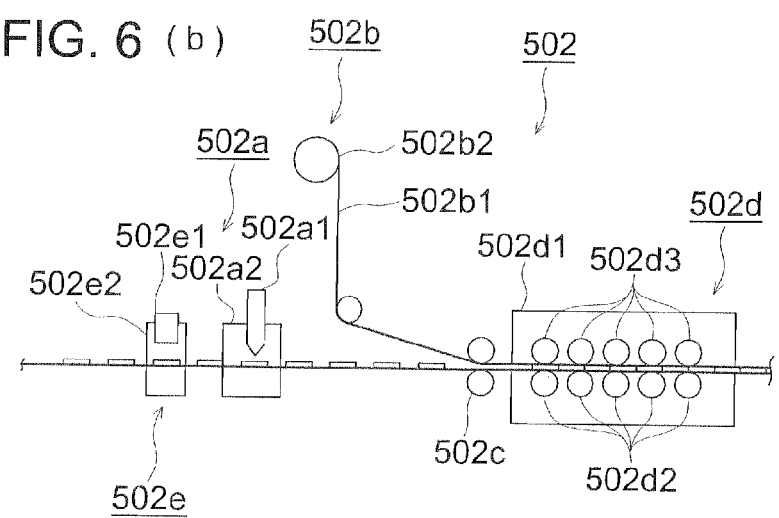

FIG. 6 is a magnified schematic drawing of a sealing member lamination process shown in FIG. 2. FIG. 6 (a) is a magnified schematic oblique view of a sealing member lamination process shown in FIG. 2. FIG. 6 (b) is a schematic cross-sectional view of FIG. 6 (a).

Sealing member lamination process 502 is provided with alignment mark detection process 502e to detect alignment marks 7d-7f arranged corresponding to the position of organic EL elements having been formed on band-form flexible support 7, sealant coating process 502e to coat a sealant fitting to the position of organic EL elements, supply process 502b of band-form flexible support 7, and lamination process 502d to laminate band-form flexible sealing member 502b1. In supply process 502b, roll-form flexible sealing member 502b2 is supplied and unwound as band-form flexible sealing member 502b1. Alignment mark detection process 502e is provided with alignment mark detector 502e1 and box body 502e2 in which alignment mark detector 502e1 is installed. Alignment detector 502e1 is arranged being adjusted to the position of alignment marks 7d-7f which is arranged on band-form flexible support 7b in advance. Information detected by alignment mark detector 502e1 is input to a control process (not shown in the drawing) to control sealant coater 502a1 in sealant coating process 502a. Alignment mark detector 502e1 is not specifically limited, and for example, image recognition by a CCD camera can be utilized. Sealant coating process 502a is provided with sealant coater 502a1, which coats a sealant on an emission region or the circumference of the emission region of organic EL element, and box body 502a in which sealant coater 502a1 is installed. The number of sealant coater 502a1 arranged is not specifically limited, however, it is preferably arranged in accordance with the number of organic EL elements arranged along the width direction of band-form flexible support. This drawing shows the case of three sets of sealant coater 502a1 being arranged organic EL organic compound layer. This drawing shows that 3 sets of sealant coater 502a1 are arranged corresponding to the number of an organic EL element. Box body 502a2 is shiftable in the x-y direction (the arrow head direction in the drawing) by a drive system (not shown in the drawing).

Lamination process 502d is provided with main body 502d1, roll 502d2 contacting with a flexible support and roll 502d3 contacting with the flexible sealant member 502b1 side, and is designed so that a flexible sealant is laminated by pressing and sandwiching band-form flexible support 7c, on which organic EL elements have been formed, and flexible sealant member 502b1 between roll 502d2 and roll 502d3. The width of flexible sealing member 502b1 is preferably identical with the width of band-form flexible support 7b Other symbols are identical with those in FIG. 2. Herein, in this drawing, a supply system of a sealant to sealant coater 502a1 is abbreviated. Lamination of flexible sealing member 502b1 on a cathode layer including a second electrode via sealant is preferably conducted under an environment of a reduced pressure of $10-1\times10^{-5}$ Pa, an oxygen concentration of not more than 10 ppm and a moisture concentration of not more than 10 ppm, in consideration of elimination of oxygen and moisture and prevention of mixing of air bubbles inside the lamination portion.

A method to coat a sealant is not specifically limited, and includes methods utilized for coating of an ordinary adhesive such as a spray method, an extrusion nozzle method, a screen printing method and a silk method. Viscosity of utilized sealant is preferably 40-400 Pa·s in consideration of such as coating uniformity and prevention of coating spread.

A liquid type sealant according to this invention includes a photo-curable and a heat-curable type sealants having a reactive vinyl group such as acrylic acid type oligomer and methacrylic oligomer, a moisture-curable type sealant such as 2-cyanoacrylic ester, a thermal and a chemical-curable (two liquid mixing) sealants such as an epoxy type and an ultraviolet curable epoxy resin sealant of a cationic curing type. It is preferable to appropriately incorporate filler in a liquid sealant. The addition amount of filler is preferably 5-70 volume % in consideration of adhesion force. Further, the size of filler incorporated is preferably 1-100 μm in consideration of adhesion force and thickness of a sealant after lamination by pressing adhesion. The type of filler incorporated is not specifically limited and includes soda glass, non-alkali glass, or metal oxide such as silica, titanium dioxide, antimony oxide, titania, alumina, zirconia and tungsten oxide.

Figure 7:
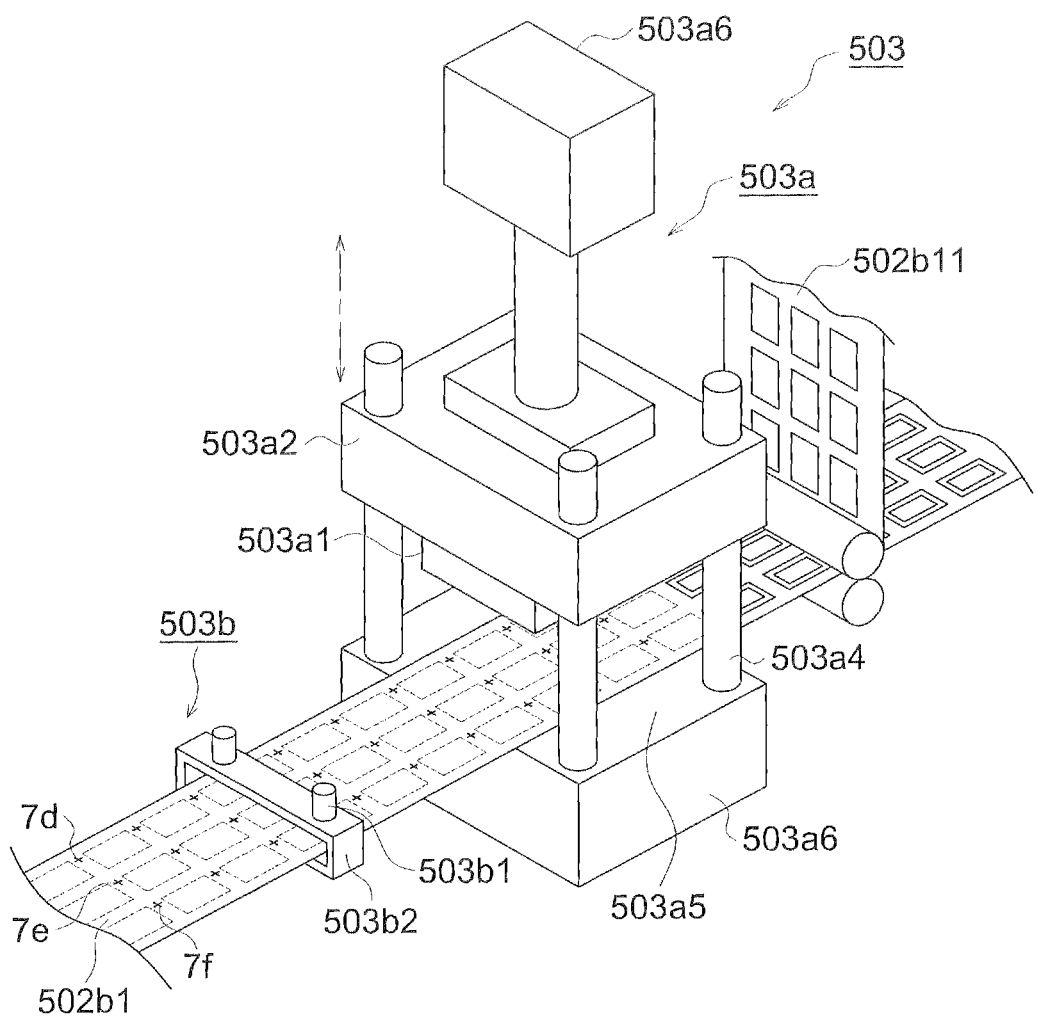
FIG. 7 is a magnified schematic oblique view of a die-cutting part shown in FIG. 2.

FIG. 7 is a magnified schematic oblique view of a die-cutting process shown in FIG. 2.

In the drawing, 503b is an alignment mark detection process to detect each alignment mark 7d-7f which is attached on a band-form flexible support in advance. Alignment mark detection process 503b is provided with alignment mark detector 503b1 and box body 503b2 in which alignment mark detector 503b1 is installed. Alignment mark detector 503b1 is not specifically limited and, for example, image recognition by a CCD camera can be utilized. Information detected by alignment mark detector 50bb1 is input to a control process (not shown in the drawing) to control die-cutter 503a. Die-cutter 503a is provided with over shape 503a2 equipped with die-cut blade 503a1 to punch out the unnecessary potion of flexible sealing member 502b which has been laminated on a band-form flexible support, four guide posts 503a4 to make movement of over shape 503*a*2 along the vertical direction possible (the arrow head direction in the drawing) and under shape 503*a*6 having mount plane 503*a*5 (also functions as a receiving part for die-cut blade 503*a*1) on which a band-form flexible support is mounted. 503*a*6 is a driving source to move over shape 503*a*2 along the vertical direction (the arrow head direction in the drawing). The number of die-cut blade 503*a*1 can be appropriately selected depending on such as the number in one die-cut and the size of die-cutter 503*a*. This drawing shows the case of 6 pieces in one die-cut. Die-cutter 503*a* employs a half-cut method to die-cut only the unnecessary portion of sealing member 502*b*. Die-cut of the unnecessary potion of sealing member 502*b*1 is made possible by shifting over shape 503*a*2 equipped with die-cut blade 503*a*1 along guide post 503*a*4 and by adjusting the lower dead point of die-cut blade 503*a*1. 502*b*11 is the unnecessary portion (the waste after die-cut) of a sealing member, which is wound up and removed. After removal of the unnecessary portion of a sealing member, a band-form flexible support on which plural organic EL elements have been formed is wound up and recovered as band-form flexible support 7*c* in a roll-form.

Figure 8:
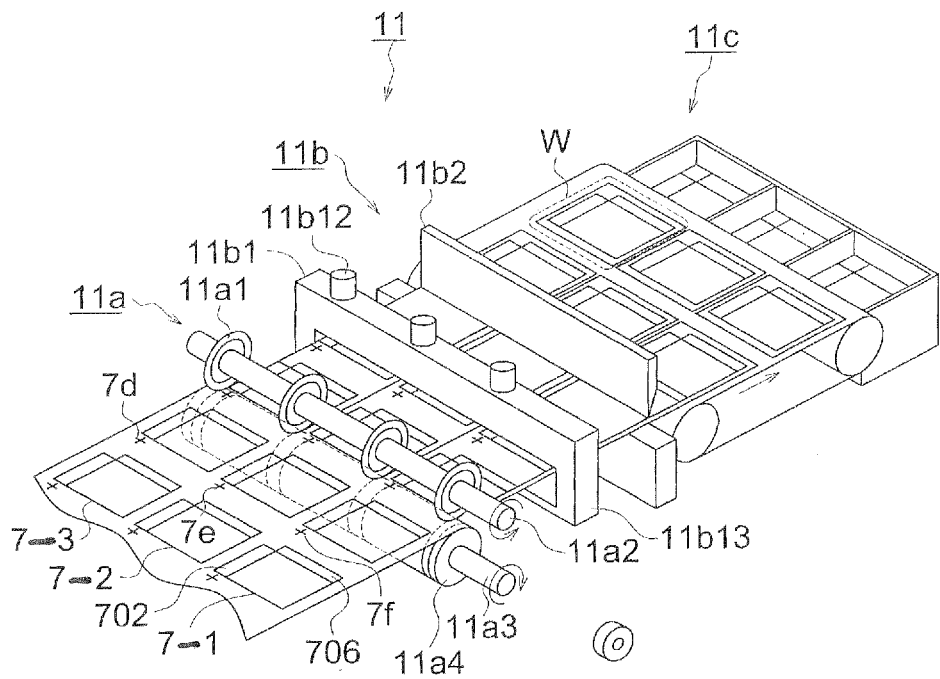
FIG. 8(a) is a magnified schematic oblique view of a portion represented by V in FIG. 3.
FIG. 8(b) is a magnified schematic top view to show an example of an organic EL element cut in FIG. 8(a).
FIG. 8(c) is a schematic cross-sectional view along line B-B' of FIG. 8(b).
Figure 8:
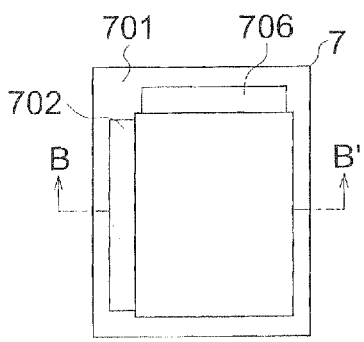
Figure 8:
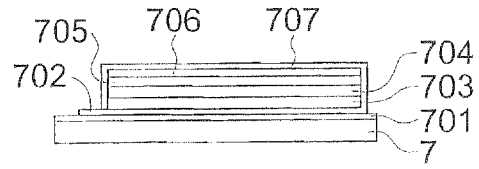

FIG. 8 is a magnified schematic drawing of a portion represented by V in FIG. 3. FIG. 8(*a*) is a magnified schematic oblique view of a cutting process represented by V in FIG. 3. FIG. 8(*b*) is a magnified schematic over view of a portion represented by W in FIG. 8(*a*). FIG. 8(*c*) is a schematic cross-sectional view along B-B' of FIG. 8(*b*).

Cutting process 11 is a process to cut for individual separation of plural number of organic EL elements which have been formed on band-form flexible support 7 after formation of a sealing layer, and band-form flexible support 7 being sent in cutting process 11 is in a state that a block of an organic EL element, which is comprised of gas barrier layer 701, first electrode 702, hole transport layer 703, emission layer 704, electron injection layer 705, second electrode 706 and sealing layer 707 having been formed in this order, have been continuously formed in three rows 7-1-7-3.

Cutting process 11 is provided with slitter 11*a* and cutter 11*b* and recovery process 11*c*. Slitter 11*a* is provided with over blade 11*a*1 attached on rotary axis 11*a*2 and under blade 11*a*4 attached on rotary axis 11*a*3, and is capable of cutting organic EL elements having been formed on band-form flexible support 7 into a narrow width band-form by each rows 7-1-7-3. Herein, over blade 11*a*1 and under blade 11*a*4 constitute one set of a cutting blade. The arrangement of over blade 11*a*1 and under blade 11*a*4 can be appropriately changed corresponding to the rows of plural number of organic EL elements having been formed on band-form flexible support 7, and this drawing shows the case of 4 sets of cutting blades being arranged.

Cutter 11*b* is provided with detection process 11*b* and a main body (not shown in the drawing) in which cutting blade 11*b*2 is installed. Detection process 11*b*1 is provided with a box body 11*b*13 in which sensor 11*b*12 is installed and box body 11*b*13 in which sensor 11*b*12 is installed. Sensor 11*b*12 is installed in box body 11*b*13 corresponding to each alignment mark 7*d*-7*f* attached on band-form flexible support 7, cutting blade 11*b*2 is driven based on information of each alignment mark 7*d*-7*f* detected by sensor 11*b*12 to cut a band-form flexible support, which has been slit in a narrow band-form by each row 7-1-7-3, by each alignment mark, whereby individual organic EL element is prepared and recovered in recovery process 11*c*.

The following effects can be obtained by manufacturing an organic EL element by use of a manufacturing apparatus, which is shown in FIGS. 2-8, to prepare an organic EL element, according to a method in which an electron injection layer, a second electrode, a sealing layer are successively accumulated after a masking member is laminated on a formation prohibition region of an organic compound layer and is peeled off after forming an organic compound layer:

1) By utilizing a masking member which is capable of being re-peeled off, pixel patter coating of an organic compound layer becomes unnecessary to enable manufacturing of an organic compound layer in a roll-to-roll method at high productivity. 2) Adaptation to a pixel size of an organic EL element on a substrate is easy and product type change can be conducted in a short time, whereby improvement of production efficiency becomes possible. 3) By utilizing a re-peelable masking member, in accordance with stabilized quality of the external connection terminal forming portion to form the external connection terminal, performance stability of an organic EL element is improved to enable manufacturing at high production efficiency. 4) Multiple pieces production from a mother material, in which plural organic EL elements have been formed, becomes possible to enable manufacturing at high production efficiency. 5) A manufacturing facility of organic EL element (manufacturing facility for illumination) having a high productivity such as a roll-to-roll method can be provided. Manufacturing of an organic EL element at high production efficiency has come to be possible.

In the following, such as a gas barrier layer, a first electrode, an emission layer, a hole transport layer, an emission layer, an electron injection layer, a second electrode and a sealing layer will be explained.

A band-form flexible support utilized for a band-form support, on which a gas barrier layer and a first electrode have been formed, according to this invention includes transparent resin film. Resin film includes polyester such as polyethylene terephthalate and polyethylene naphthalene, polyethylene, polypropylene, cellophane, cellulose esters such as cellulose diacetate, cellulose triacetate, cellulose acetate butyrate, cellulose acetate propionate, cellulose acetate phthalate and cellulose nitrate, and derivatives thereof, polyvinylidene chloride, polyvinyl alcohol, polyethylene vinylalcohol, syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluorine resin, nylon, polymethyl methacrylate, acryls or poyallylates, and cycloolefin type resin such as Arton (product name, manufactured by JSR Corp.) and Apel (product name, manufactured by Mitsui Chemicals, Inc.).

The thickness is not specifically limited, however, is preferably 0.05-1 mm in consideration of such as handling and tracking characteristics. The width of a band-form support is not specifically limited and can be appropriately selected according to an image plane size of an electroluminescence display utilized.

A band-form support may be incorporated with such as an additive; for example, the support may be incorporated with a near-infrared absorbent to absorb near-infrared rays generated from the front surface of a panel in the case of an electromagnetic wave shielding transparent plate is mounted on the front surface of a plasma display panel, or may be colored with a colorant such as dye or pigment to improve visibility of a display.

It is preferable to appropriately form gas barrier film on the surface of resin film utilized as a band-form flexible support. Gas barrier film includes film of an inorganic substance, an organic substance or hybrid film of the both. As the characteristic of gas barrier film, a water vapor permeability (at $25\pm0.5°$ C. and relative humidity of $(90\pm2)\%$ RH), which is measured based on JIS K 7129-1992, is preferably not more than 0.01 g/(m²·24 h). Further, film having high barrier capability such as an oxygen permeability, which is measured based on JIS K 7126-1987, of not more than $10^{-1}$ ml/(m²·24 h·MPa) and a water vapor permeability (at 25±0.5° C. and relative humidity of (90±2) % RH), which is measured based on JIS K 7129-1992, of not more than $10^{-5}$ g/(m²·24 h) is preferable.

As a material to form barrier film, a material provided with a function to restrain invasion of such as moisture and oxygen which may induce deterioration, is preferable and such as silicon oxide, silicon dioxide and silicon nitride can be utilized. Further, to overcome brittleness of said film, it is more preferable to provide an accumulation structure comprising an inorganic layer and a layer comprising an organic material. The order of accumulation of an inorganic layer and an organic layer is not specifically limited; however, it is preferable to alternately accumulate the both in plural times. A forming method of barrier film is not specifically limited, and such as a vacuum evaporation method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method and a coating method can be utilized, however, an atmospheric pressure plasma polymerization method such as described in JP-A 2004-68143 is specifically preferable.

As a first electrode, those employing a metal, an alloy, a conductive compound and mixtures thereof having a large work function (not less than 4 eV) as an electrode substance are preferably utilized. Specific examples of such an electrode substance include a metal such as Au and a conductive transparent material such as CuI, indium tin oxide (ITO), $SnO_2$ and ZnO. Further, a material capable of forming amorphous and transparent conductive film such as IDIXO ($In^2O_3$.ZnO) may be also utilized. As an anode, a pattern of a desired form may be formed by a photolithographic method after forming thin film of an electrode substance by a method such as evaporation or sputtering, or the pattern may be formed through a mask of a desired form at the time of evaporation or sputtering of the above-described electrode substance in the case of patterning precision being not much required (approximately not less than 100 μm). Further, in the case of utilizing a substance capable of being coated such as an organic conductive compound, a wet film forming method such as a printing method and a coating method can be also utilized. When emission is taken out from this anode, the transmittance is desirably made to be not less than 10%, and a sheet resistance as an anode is preferably not more than a few hundreds Ω/□. Further, a layer thickness depends on a material, however, is selected in a rage of generally 10-1,000 nm and preferably 10-200 nm.

Between a first electrode and an emission layer or a hole transport layer, a hole injection layer (an anode buffer layer) may be provided. A hole injection layer is a layer provided between an electrode and an organic layer in order to decrease driving voltage and improve emission brightness, and is detailed in 2nd volume 2nd chapter "Electrode Material" (pp. 123-166) of "Organic EL Element and Front of Industrialization Thereof (Published by N. T. S. Co., Ltd., Nov. 30, 1998)". An anode buffer layer (a hole injection layer) is detailed also in such as JP-A Nos. 9-45479, 9-260062 and 8-288069, and specific examples include a phthalocyanine buffer layer represented by copper phthalocyanine, an oxide buffer layer represented by vanadium oxide, an amorphous carbon buffer layer, and a polymer buffer layer utilizing conductive polymer such as polyaniline (emeraldine) and polythiophene.

A hole transport layer is comprised of a hole transport material having a function to transport a hole, and a hole injection layer and an electron block layer are also included in a hole transport layer in a broad sense. A hole transport layer may be provided as a single layer or plural layers. A hole transport material is one having of injection or transport capability of a hole, or blocking capability against an electron, and may be either an organic substance or an inorganic substance. For example, listed are triazole derivatives, oxazole derivatives, imidazole derivatives, polyarylalkane derivatives, pyrazoline derivatives and pyrazolone derivatives, phenylenediamine derivatives, arylamine derivatives, amino substituted calcon derivatives, oxazole derivatives, styrylanthrathene derivatives, fluorenone derivatives, hydrazone derivatives, stilbene derivatives, silazane derivatives, aniline type copolymer and conductive polymer oligomer and specifically thiophene oligomer.

As a hole transport material, the above-described ones can be utilized, however, a porphyrin compound, an aromatic tertiary amine compound and a styrylamine compound are preferably utilized and an aromatic tertiary amine compound is specifically preferably utilized. Typical examples of an aromatic tertiary amine compound and a styrylamine compound include N,N,N',N'-tetraphenyl-4,4'-diaminophenyl; N,N'-diphenyl-N,N'-bis(3-methylphenyl)-[1,1'-biphenyl]-4, 4'-diamine (TPD); 2,2-bis(4-di-p-tolylaminophenyl)propane; 1,1-bis(4-di-p-tolylaminophenyl)cyclohexane; N,N, N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quardoriphenyl; N,N,N-tri(p-tolyl)amine; 4-(di-p-tolylamino)-4'-[4-(di-p-tolylamino)stilyl]stilben; 4-N,N-diphenylamino-(2-diphenylvinyl)benzene; 3-methoxy-4'-N,N-diphenylaminostilben; and N-phenylcarbazole, and further, those having two condensed aromatic rings in a molecule which are described in U.S. Pat. No. 5,061,569 such as 4,4'-bis[N-(1-naphtyl)-N-phenylamino]biphenyl (NPD) and such as 4,4',4"-tris[N-(3-methylphenyl)-N-phenylamino]triphenylamine (MTDATA), in which three triphenylamine units are connected in a star burst form, described in JP-A 4-308688.

Further, a polymer material, in a polymer chain of which these materials have been introduced, or in which these materials are employed as the polymer main chain, can be utilized. Further, an inorganic compound of such as p-type Si and p-type-SiC can be also utilized as a hole injection material or a hole transport material.

Further, a so-called p-type hole transport material such as described in JP-A 11-251067 and Applied Physics Letters 80, p. 139 (2002) by J. Huang et al. can be also utilized. In this invention, these materials are preferably utilized because an emission element having higher efficiency can be obtained.

The layer thickness of a hole transport layer is not specifically limited, however, is generally approximately 5 nm-5 μm and preferably 5-200 nm. This hole transport layer may be provided with one layer structure comprising one type or not less than two types of the above-described materials. Further, a hole transport layer which is doped with an impurity to have a high p property can be also utilized. The examples include those described in such as JP-A Nos. 4-297076, 2000-196140 and 2001-102175; and J. Appl Phys., 95, 5773 (2004). It is preferable to utilize such a hole transport layer having a high p property because an organic EL element exhibiting lower power consumption can be prepared.

In this invention, an emission layer means a blue emission layer, a green emission layer and a red emission layer. The order of accumulation of emission layers in the case of accumulating emission layers is not specifically limited, and further, a non-emission intermediate layer may be provided between each emission layer. In this invention, at least one blue emission layer is preferably arranged at a position nearest to an anode among all emission layers. Further, when not less than four emission layers are arranged, a blue emission layer, a green emission layer and a red emission layer are preferably accumulated in this order from the nearest to an anode, such as a blue emission layer/a green emission layer/a red emission layer/a blue emission layer, a blue emission layer/a green emission layer/a red emission layer/a blue emission layer/a green emission layer, a blue emission layer/a green emission layer/a red emission layer/a blue emission layer/a green emission layer/a red emission layer, with respect to increasing brightness stability. It is possible to prepare a white element by constituting an emission layer comprising multiple layers.

The total layer thickness of an emission layer is not specifically limited, however, is selected generally in a range of 2 nm-5 μm and preferably 2-200 nm, in consideration of such as homogeneousness of the film and voltage required for emission. It is furthermore preferably in a range of 10-20 nm. The layer thickness is preferably set to not more than 20 nm because that there is an effect to improve stability of emission color against drive current in addition to voltage aspect. A layer thickness of each emission layer is preferably selected in a range of 2-100 nm and more preferably in a range of 2-20 nm. The relationship of layer thickness among each emission layer of blue, green and red is not specifically limited; however, it is preferable that a blue emission layer (as the total when plural layers are present) has the largest layer thickness among three emission layers.

An emission layer contains at least three layers having different emission spectra, the emission maximum wavelengths of which are in a range of 430-480 nm, 510-550 nm and 600-640 nm, respectively. There is no specific limitation provided that not less than three layers present. In the case of not less than 4 layers, there may be plural layers having the same emission spectrum. A layer having an emission maximum wavelength of 430-480 nm is referred to as a blue emission layer; a layer having an emission maximum wavelength of 510-550 nm is referred to as a green emission layer; and a layer having an emission maximum wavelength of 600-640 nm is referred to as a red emission layer. Further, in a range of maintaining the aforesaid maximum wavelength, plural number of emission compounds may be mixed in each emission layer. For example, in a blue emission layer, a blue emitting compound having a maximum wavelength of 430-480 nm and a green emitting compound having a maximum wavelength of 510-550 nm may be utilized by being mixed.

A material utilized in an emission layer is not specifically limited, and includes various types of materials such as described in The Up-to-date Trend of Flat Panel Display; The Present State and Up-to-date Technical Trend of EL Display, edited by Toray Research Center Co., Ltd., pp. 228-332.

An emission layer is a layer to emit by recombination of an electron an a hole which are injected from an electrode or an electron injection layer, and from a hole transport layer; and the emission portion may be either the inside of an emission layer or the interface between an emission layer and an adjacent layer.

A hole transport layer forming coating solution and an emission layer forming coating solution utilized are provided with at least one type of an organic compound material and a solvent and the surface tension is preferably $15 \times 10^{-3} - \times 10^{-3}$ N/m in consideration of repellent spots and coating unevenness at the time of coating.

A process to form a hole transport layer and an emission layer which are constituent layers of an organic EL element shown in this drawing is preferably operated under a dew point of not higher than −20° C., a cleanliness degree, which is measured based on JISB 9920, of not higher than class 5, atmospheric pressure of 10-45° C. except the drying process. In this invention, a cleanliness degree of not higher than 5 indicates class 3-class 5.

An electron injection layer is comprised of a material having a function to transport an electron and is included in an electron transport layer in a broad sense. An electron injection layer is a layer provided between an electrode and an organic layer in order to decrease driving voltage and improve emission brightness, and is detailed in 2nd volume 2nd chapter "Electrode Material" (pp. 123-166) of "Organic EL Element and Front of Industrialization Thereof (Published by N. T. S. Co., Ltd., Nov. 30th, 1998)". An electron injection layer (a cathode buffer layer) is detailed also in such as JP-A Nos. 6-325871, 9-17574 and 10-74536, and specific examples include a metal buffer layer represented by such as strontium and aluminum, an alkali metal compound buffer layer represented by lithium fluoride, an alkaline earth metal compound buffer layer represented by magnesium fluoride and an oxide buffer layer represented by aluminum oxide. The above-described buffer layer (an injection layer) is desirably very thin film and the layer thickness, although it depends on the material, is preferably in a range of 0.1 nm-5 μm.

Other electron transport material utilized in an electron transport layer adjacent to the emission layer side is provided with a function of transmitting an electron injected from an electrode to an emission layer and can be arbitrarily selected among compounds, conventionally well known in the art, including such as nitro substituted fluorene derivatives, diphenylquinone derivatives, thiopyraneoxide derivatives, carbodiimide, fluorenyliden methane derivatives, anthraquinodimethane and anthrone derivatives, and oxadiazole derivatives. Further, thiazole derivatives in which an oxygen atom of an oxadiazole ring is substituted by a sulfur atom in the above-described oxadiazole derivatives, and quinoxaline derivatives having a quinoxaline ring which is known as an electron attracting group can be also utilized as an electron transport material. Further, polymer materials, in which these material is introduced into a polymer chain or these materials are employed as a polymer main chain, can be also utilized.

Further, metal complexes of an 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq), and in addition to these, metal complexes in which the central metal of these metal complexes is replaced by In, Mg, Cu, Ca, Sn, Ga or Pb can be also utilized as an electron transport material. In addition, metal-free or metal phthalocyanine, or those the terminal thereof is substituted by such as an alkyl group or a sulfonic acid group can be also preferably utilized as an electron transport material. Further, a distyrylpyradine derivative can be also utilized as an electron transport material, and similar to the cases of a hole injection layer and a hole transport layer, inorganic semiconductors of such as n-type Si and n-type SiC can be also utilized as an electron transport material. The layer thickness of an electron transport layer is not specifically limited; however, is generally approximately 5 nm-5 μm and preferably 5-200 nm. An electron transport layer may have one layer structure comprising one type or at least two types of the above-described materials.

Further, an electron transport layer which is doped with impurities to provide a high n-property may be also utilized. Such examples includes those described in such as JP-A Nos. 4-297076, 10-270172, 2000-196140 and 2001-102175, and J. Appl. Phys., 95, 5773 (2004). To utilize such an electron transport layer having a high n-property is preferred because an element exhibiting low power consumption can be prepared. An electron transport layer can be also formed by making the above-described electron transport material into a thin film by a method well known in the art such as a wet coating method and a vacuum evaporation method.

As a second electrode, those employing a metal having a small work function (not more than 4 eV) (referred to as an electron injecting metal), an alloy, an electric conductive compound and a mixture thereof as an electrode substance are utilized. Specific examples of such an electrode substance include such as sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and a rare earth metal. Among them, preferable is a mixture of an electron injecting metal and the second metal, which has a work function larger than said metal and is stable, such as a magnesium/silver mixture, a magnesium/aluminum mixture, a magnesium/indium mixture, an aluminum/aluminum oxide ($Al_2O_3$) mixture, a lithium/aluminum mixture and aluminum. A cathode can be prepared by making these electrode substances into thin film by means of evaporation or sputtering. Further a sheet resistance as a cathode is preferably not more than a few hundreds $\Omega/\square$; a layer thickness is generally selected in a range of 10 nm-5 µm and preferably in a range of 50-200 nm. Herein, to transmit emitted light, it is convenient to improve emission brightness provided that either one of an anode or a cathode of an organic EL element is transparent or translucent.

Further, after forming the above-described metal at a layer thickness of 1-20 nm, by forming a conductive transparent material, which was described in the explanation of a first electrode, thereon as a second electrode, it is possible to prepare a transparent or translucent second electrode (cathode), whereby an element, the both a first electrode (an anode) and a second electrode (a cathode) of which are provided with transparency, can be prepared.

In an emission layer constituting an organic EL element of this invention, a host compound well known in the art and a phosphorescent compound (also referred to as a phosphorescence emitting compound) well known in the art are preferably incorporated to increase emission efficiency of an emission layer.

A host compound is defined as a compound which occupies not less than 20 weight % in the layer based on a weight ratio among compounds contained in an emission layer and has a phosphorescence quantum efficiency of phosphorescent emission at room temperature (25° C.) of less than 0.1. The phosphorescence quantum efficiency is preferably less than 0.01. Plural types of host compounds may be utilized together. By utilizing plural types of host compounds, it is possible to control charge transfer and to prepare an organic EL having high efficiency. Further, by utilizing plural types of phosphorescent compounds, it becomes possible to mix different emission resulting in preparation of an arbitrary emission color. By adjusting a type and a doping amount of a phosphorescent compound, it is possible to obtain white emission, which can be applied for illumination and backlight.

As these host compounds, preferable is a compound which prevents emission from going to a longer wavelength and has a high Tg (glass transition temperature) in addition to having hole transport ability and electron transport ability. Host compounds well known in the art include compounds described in such as JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

In the case that an emission layer is provided with plural number of emission layers, it is preferable that not less than 50 weight % of host compounds of these layers are the same compound with respect to easy achievement of a homogeneous film properties all over the organic layer, and a phosphorescence emission energy of a host compound is preferably not less than 2.9 eV because it is advantageous to efficiently restrain energy transfer from a dopant and to obtain high brightness. Phosphorescence emission energy refers to a peak energy of the 0-0 band of phosphorescence emission when a photoluminescence is measured by forming an evaporated film of a host compound having a thickness of 100 nm on a substrate.

A host compound preferably has a phosphoresce emission energy of not less than 2.9 eV and Tg of not lower than 90° C. in consideration of such as deterioration of an organic EL element in aging (brightness decrease, deterioration of film properties) and market needs as a light source. That is, to satisfy the both of brightness and durability, those having phosphorescence emission energy of not less than 2.9 eV and Tg of not lower than 90° C. are preferable. Tg is furthermore preferably not lower than 100° C.

A phosphorescent compound (phosphorescence emitting compound) is a compound in which emission from an exited triplet state is observed and which emits phosphorescence at room temperature (25° C.), and is a compound having a phosphorescence quantum yield at 25° C. of not less than 0.01. By utilizing a phosphorescent compound together with a host compound explained before, an organic EL element having further higher emission efficiency can be prepared.

A phosphorescent compound according to this invention preferably has a phosphorescence quantum yield of not less than 0.1. The above-described phosphorescence quantum yield can be measured by a method described at p. 398 of Spectroscopy II of the 4th edition Experimental Chemistry Course 7 (Maruzen, 1992). A phosphorescence quantum yield in a solution can be measured employing various types of solvents; however, it is all right provided that a phosphorescent compound utilized in this invention achieves the above-described phosphorescence quantum yield in any one of arbitrary solvents.

A principle of emission of a phosphorescent compound includes two types; one is an energy transfer type in which recombination of a carrier is caused on a host compound, which transport a carrier, to generate an exited state of a host compound and this energy is transferred to a phosphorescent compound resulting in obtaining emission from the phosphorescent compound, and the other is a carrier trap type in which a phosphorescent compound functions as a carrier trap to cause recombination of a carrier on a phosphorescent compound resulting in obtaining emission; however, in either case, it is necessary that energy of an exited state of a phosphorescent compound is lower than energy of an exited state of a host compound.

A phosphorescent compound can be utilized by appropriate selection among those which are well known in the art and utilized in an emission layer of an organic EL element. A phosphorescent compound is preferably a complex type compound containing a metal of the 8-10th groups of the periodic table of elements, more preferably an iridium compound, an osmium compound, a platinum compound (a platinum complex type compound) or a rare earth compound, and most preferably is an iridium compound among them.

In this invention, the phosphorescence emission maximum wavelength of a phosphorescent compound is not specifically limited, and the emission wavelength obtained can be principally varied by selecting the central metal, the ligand and the substitution position of the ligand.

Color of emission from an organic EL element of this invention and from a compound according to this invention is determined by a color when a measured result by use of Spectral Radiation Brightness Meter CS-1000 (manufactured by Konicaminolta Sensing Corp.) according to p. 108, fig. 4.16 in "New Edition Color Science Handbook" (Edited by Japan Color Society, Tokyo University Publishing Association, 1985) is applied into CIE chromaticity coordinates.

A white element in this invention refers that chromaticity in CIE 1931 color specification system at 1,000 Cd/m$^2$, when a front brightness at 20 viewing angle is measured by the above-described method, is within a region of X=0.33±0.07, Y=0.33±0.07.

Take out efficiency of an organic EL element of this invention at room temperature is preferably not less than 1%, and more preferably not less than 5%. Herein, take out quantum efficiency (%)=(a number of photons emitted outside of an organic EL element/a number of electrons flown into an organic EL element)×100.

Further, a hue improving filter such as a color filter may be utilized together, and a color conversion filter, which converts emission color from an organic EL element into multicolor by use of a fluorescent substance, may be also utilized together. In the case of utilizing a color conversion filter, λmax of emission of an organic EL element is preferably not longer than 480 nm.

An organic EL element of this invention preferably employs the following method in combination to efficiently take out light generated in an emission layer. In an organic EL element, it is generally said that emission is generated at the inside of a layer having a refractive index higher than air (refractive index of approximately 1.7-2.1) and only 15-20% of light generated in an emission layer can be taken out. This is because light incident into the interface at an angle θ over the critical angle causes total reflection to make taking out of an element impossible, and because light causes total reflection between a transparent electrode or an emission layer and a transparent substrate to be guided through the transparent electrode or the emission layer resulting in light escape along the side surface direction of an element.

As a method to improve this take out efficiency of light includes, for example, a method in which roughness is formed on the transparent substrate surface to prevent total reflection at the interface of a transparent substrate and the air (U.S. Pat. No. 4,774,435), a method to improve the efficiency by providing a substrate with a condensing property (JP-A 63-314795), a method to form a reflective plane on such as the side surface of an element (JP-A 1-220394), a method to introduce a flat layer having an intermediate refractive index between a substrate and a fluorescent substance to form anti-reflection film (JP-A 62-172691), a method to introduce a flat layer having a refractive index lower than that of a substrate between a substrate and a fluorescent substance (JP-A 2001-202827), and a method to form a diffraction grating at the interlayer of any one of a substrate, a transparent electrode and an emission layer (including the interface between a substrate and the outside) (JP-A 11-283751).

In this invention, these methods can be utilized in combination with an organic EL element, however, a method to introduce a flat layer having a refractive index lower than that of a substrate between a substrate and a fluorescent substance or a method to form a diffraction grating at the interlayer of any one of a substrate, a transparent electrode and an emission layer (including the interface between a substrate and the outside) is preferably utilized. In this invention, by combining these methods, an element having further high brightness or excellent durability can be prepared.

In the case that a medium having a low refractive index is formed between a transparent electrode and a transparent substrate at a thickness of longer than a wavelength of light, light emitted from the transparent electrode has the higher efficiency of taking out when a refractive index of a medium is the lower. A low refractive index layer includes such as aerogel, porous silica, magnesium fluoride and fluorine-containing polymer. Since a refractive index of a transparent substrate is generally approximately 1.5-1.7, a low refractive index layer preferably has a refractive index of approximately not more than 1.5 and more preferably of not more than 1.35. A thickness of a low refractive index layer is preferably at least twice of a wavelength in the medium. This is because an effect of a low refractive index layer will be decreased when a thickness of a low refractive index medium becomes approximately as small as a wavelength of light which makes electromagnetic waves bleed out by evanescent and invade into a substrate. A method to introduce a diffraction grating to the interface or to any medium which causes total reflection is characterized by a high improvement effect of taking out of light. In this method, by utilizing a property to change the direction of light into a specific direction different from refraction by so-called Bragg's diffraction such as primary diffraction and secondary diffraction, light which cannot go out due to such as total reflection between layers among light generated from an emission layer is made to be diffracted by introduction of a diffraction grating to any of inter-layers or in a medium (such as a transparent substrate or a transparent electrode), whereby light will be taken out. A diffraction grating introduced is preferably provided with a two dimensional periodic refractive index. This is because light emitted in an emission layer will be randomly generated in all directions and only light advancing a specific direction is diffracted by an ordinary one-dimensional diffraction grating, which has a diffractive index distribution only in a certain direction, resulting in not so much increase of taking out efficiency of light. However, by making the refractive index distribution two-dimensionally, light advancing all directions will be diffracted to increase taking out efficiency of light.

The position to introduce a diffraction grating may be either any one of inter-layers or in media (in a transparent substrate or in a transparent electrode); however, is desirably the neighborhood of an organic emission layer where light is generated. In this case, the period of a diffraction grating is preferably approximately ½-3 times of a wavelength of light in the medium. The arrangement of a diffraction grating is preferably those in which an arrangement is repeated two dimensionally such as a square lattice form, a triangle lattice form and a honeycomb lattice form.

Further, an organic EL element of this invention can be made to have higher brightness in a specific direction by such as processing to provide a structure of a micro-lens form on the light take-out side of a substrate, or by combining with a so-called light-condensing sheet to condense light to the front direction against an element emission plane. As an example of a micro-lens alley, a square pyramid is arranged two-dimensionally so as to make one edge of 30 µm and the peak angle of 90 degree on the light take out side of a substrate. One edge is preferably 10-100 µm. An effect of diffraction will be generated to cause coloring when it is not more than this, while it is not preferable that the thickness is increased when it is excessively large.

As a condenser sheet, for example, those practically employed in an LED backlight of a liquid crystal display can be utilized. As such a sheet, for example, brightness enhancing film (BEF) manufactured by Sumitomo 3M Ltd. can be utilized. As a form of a prism sheet, for example, employed may be a form in which stripes of a triangle form having a peak angle of 90 degree and a pitch of 50 µm are formed on a substrate, a form having a rounded peak angle, a form having randomly varying pitches or other forms. Further, a light scattering plate-film to control the light emission angle from an emission element may be utilized together. For example, Diffusion. Film (Light Up) manufactured by Kimoto Co., Ltd. can be utilized.

As a sealing member utilized in a sealing process shown in FIG. 2, multi-layer film provided with a resin substrate and a barrier layer is utilized. The resin substrate is not specifically limited, and thermoplastic film materials utilized in general packaging film such as ethylene tetrafluoroethyl copolymer (ETFE), high density polyethylene (HDPE), oriented polypropylene (OPP), polystyrene (PS), polymethyl-methacrylate (PMMA), oriented nylon (ONy), polyethylene teraphthalate (PET), polycarbonate (PC), polyimide and polyether sulfone (PES) can be utilized. Further, these thermoplastic films can be utilized also as multi-layer film prepared by co-extrusion appropriately together with different film and multi-layer film prepared by laminating films varying the orientation angles. Further, to obtain required physical properties, it is natural to prepare film by varying density and molecular weight distribution of film.

A barrier layer includes inorganic evaporation film and metal foil. Inorganic film includes those described in Thin Film Handbook pp. 879-901 (Japan Society for Promotion of Science), Vacuum Technology Handbook pp. 502-509, p. 612 and p. 810 (The Nikkan Kogyo Shinbunn Ltd.), Vacuum Handbook, extra number, pp. 132-134 (ULVAC, Inc.) For example, metal such as In, Sn, Pb, Au, Cu, Ag, Al, Ti and Ni; MgO, SiO, $SiO_2$, $Al_2O_3$, GeO, NiC, CaO, BaO, $FeO_3$, $Y_2O_3$, $TiO_2$, $Cr_2O_3$, $Si_xO_y$ (x=1, y=1.5-2.0), $Ta_2O_3$, ZrN, SiC, TiC, PSG, $Si_3N_4$, single crystal Si, amorphous Si and W are utilized.

Further, as a material of metal foil, for example, metal materials such as aluminum, copper and nickel; alloy materials of such as stainless and aluminum alloy can be utilized, however, aluminum is preferred with respect to a processing adaptability and a cost aspect. The layer thickness is approximately 1-100 µm and preferably 10-50 µm.

Further, a sealant layer is preferably provided on a barrier layer. As a sealant layer, thermoplastic film having a melt flow rate defined in JIS K 7210 of 5-20 g/10 min is preferably utilized and thermoplastic film having a melt flow rate of 6-15 g/10 min is more preferably utilized. This is because a gap portion caused by a step difference between the pick up electrodes of each electrode cannot be completely buried when resin having a melt flow rate of not more than 5 (g/10 min), while such as tensile strength, anti stress cracking property and processing property will be deteriorated when resin having a melt flow rate of not less than 20 (g/10 min). Thermoplastic film is not specifically limited provided satisfying the above value, however, polymer film described in New Development of Functional Packaging Materials" (Toray Research Center) such as low density polyethylene (LDPE), HDPE, linear low density polyethylene (LLDPE), medium density polyethylene, non-oriented polypropylene (CPP), OPP, ONy, PET, cellophane, polyvinyl alcohol (PVA), oriented vinylon (OV), ethylene-vinyl actate copolymer (EVOH), ethylene-propylene copolymer, ethylene-acrylic acid copolymer, ethylene-methacrylic acid copolymer and vinylidene chloride (PVDC) can be utilized. Among these thermoplastic film, LDPE and LLDPE; LDPE and LLDPE which are manufactured by utilizing a metallocene catalyst; and film comprising these film and HDPE film in combination are specifically preferably utilized.

A flexible sealing member utilized to form a sealing layer is preferably utilized as an accumulated film state comprising a barrier layer (and appropriately a protective layer) formed on a resin substrate. As a producing method of accumulated film, various types of methods well known in the art, such as a wet lamination method, a dry lamination method, a hot-melt lamination method, an extrusion lamination method and a thermal lamination method, can be employed on thermoplastic film having been evaporated with an inorganic substance and on thermoplastic film having been laminated with aluminum foil.

In the case of a flexible sealing member being utilized to form a sealing layer, the side to contact with an adhesive is preferably a barrier layer (a protective layer when a protective layer is present).

As a material to form film in sealing layer forming process 10 shown in FIG. 3, a material provided with a function to restrain invasion of such as moisture and oxygen, which may induce deterioration of an element, is preferable and such as silicon oxide, silicon dioxide and silicon nitride can be utilized. Further, to overcome brittleness of said film, it is more preferable to provide an accumulation structure comprising an inorganic layer and a layer comprising an organic material. A forming method of these film is not specifically limited, and such as a vacuum evaporation method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method and a coating method can be utilized.

EXAMPLES

In the following, specific effects of this invention will be shown referring to examples, however, an embodiment of this invention is not limited thereto.

Example 1

Preparation of Band-Form Flexible Support

Polyether sulfon (film manufactured by Sumitomo Bakelite Co., Ltd., hereinafter, being abbreviated as PES) having a thickness of 200 µm and a width of 250 mm was prepared.

(Preparation of Transparent Gas Barrier Layer)

Transparent gas barrier film in which three units comprising a low density layer, a medium density layer, a high density layer and a medium density layer were accumulated on the prepared PES by means of a plasma discharge treatment method, was prepared. A moisture permeability measured by means of a method based on JIS K 7129-1992 was not higher than $10_{-3}$ g/(m$^2$·24 h). An oxygen permeability measured by means of a method described in JIS K 7126-1987 was not higher than $10^{-3}$ ml/(m$^2$·24 hr-MPa).

(Preparation of Band-Form Flexible Support Bearing First Electrode)

On the formed barrier layer, after ITO (indium tin oxide) having a thickness of 120 nm was formed by an evaporation method so as to form a first electrode of 50 mm wide and 50 mm long per one piece, continuously in three rows (row interval of 30 mm) along the width direction of a band-form flexible support to make a distance between each electrode of 25 mm along the conveying direction as shown in FIG. 3 (*a*), the support was wound on a core to be a roll form, whereby a master roll was prepared.

(Preparation of Masking Member)

As a substrate, polypropylene film having a thickness of 25 μm was utilized and masking members varying adhesive strength as shown in table 1 were prepared to be Nos. 1-a-1-f. Herein, adhesive strength indicates a value measured based on a measurement of adhesion force at 180 degree separation defined by JIS Z-0237 adhesive tape-adhesive sheet test method. Variation of adhesion force was made by varying temperature at the time of pressing adhesion. Herein, the width of a masking member was 25 mm.

TABLE 1

| Masking member No. | Adhesive strength (N/25 mm) |
|---|---|
| 1-a | 0.8 |
| 1-b | 1.0 |
| 1-c | 4.1 |
| 1-d | 6.6 |
| 1-e | 10.0 |
| 1-f | 12.5 |

(Lamination of Masking Member and Formation of Organic Compound Layer)

By use of a manufacturing apparatus shown in FIG. 3, the prepared masking member Nos. 1-a-1-f was laminated on the intervals of each first electrode of a band-form flexible support bearing a first electrode prepared in a state shown in FIG. 4; a hole transport layer forming coating solution was coated-dried under the following condition to form a hole transport layer; an emission layer forming coating solution was coated-dried under the following condition to form an emission layer; a masking member was removed by peeling to prepare a band-form flexible support bearing up to an emission layer; which was subjected to a charge neutralization treatment and cooled down to be the same temperature as room temperature; and was wound on a core to be a roll form to prepare Nos. 1-1-1-6. Herein, before lamination of a masking member, a band-form flexible support bearing a first electrode was subjected to a washing surface modification treatment at irradiation strength of 15 mW/cm$^2$ and a distance of 10 mm by use of a low pressure mercury lamp having a wavelength of 184.9 nm, followed by being subjected to a charge neutralizing treatment with a very weak X ray charge neutralizer. The lamination speed of a masking member was 1.0 m/min, and a surface pressure of a pressure roll was 0.2 MPa. Further, until peeling-off of the masking member, except solvent removal and heating processes of a hole transport layer and an emission layer, manufacturing was conducted under an atmospheric pressure environment of a dew point of not higher than −20° C., a cleanliness degree of not higher than class 5 (JIS B 9920), and 10-45° C.

(Formation of Hole Transport Layer)

(Preparation of Hole Transport Layer Coating Solution)

An original solution of polyethylene oxythiophene/polystyrene sulfonate aqueous dispersion (PEDOT/PSS, Bytron P AI 4083, manufactured by Bayer AG.) was diluted to 140% with pure water and to 10% with methanol so as to make a solid content of 0.5 weight %, to be a hole transport layer coating solution. The surface tension of a hole transport layer coating solution was 45 mN/m (measured by Surface Tension Meter CBVP-A3, manufactured by Kyowa Interface Science Co., Ltd.).

(Coating of Hole Transport Layer)

The gap between a coater of a slit type and a substrate was set to 100 μm, the above described hole transport layer coating solution being coated so as to make a coated layer thickness of 10 μm (a dry layer thickness of 50 nm); utilizing the first dryer and the first heater, the solvent being removed in the first dryer by wind toward, the surface, on which film is to be coated, at a height from ejection outlet of a slit nozzle type of 100 mm, an ejection wind speed of 1 m/s, a wind speed distribution in the width direction of 5% and a temperature of 100° C.; successively, being subjected to a heat treatment of a back surface heat transmission method in the first heater at a temperature of 120° C.; whereby a hole transport layer was formed.

(Formation of Emission Layer)

(Preparation of Emission Layer Coating Solution)

Polyvinyl carbazole (PVK) as a host material, being mixed with a green dopant material Ir(ppy)$_3$ to make a dopant content of 6 weight %, was dissolved in 1,2-dichloroethane as a solvent to make the total solid content of a host material and a dopant material of 1 weight %, whereby a solution was prepared. The surface tension of emission layer forming coating solution was 32 mN/m (measured by Surface Tension Meter CBVP-A3, manufactured by Kyowa Interface Science Co., Ltd.).

(Coating of Emission Layer)

Successively on a hole transport layer, which is appropriately subjected to a charge neutralization treatment, the gap between a coater of a slit type and a substrate being set to be 100 μm, the above-described emission layer coating solution was coated so as to make a coated layer thickness of 10 μm (a dry layer thickness of 100 nm), utilizing the second dryer and the second heater, the solvent was removed in the second dryer by wind toward the surface, on which film is to be formed, at a height from ejection outlet of a slit nozzle type of 100 mm, an ejection wind speed of 1 m/s, a wind speed distribution in the width direction of 5% and a temperature of 100° C., successively, being subjected to a heat treatment in the second heater at a temperature of 120° C.; whereby an emission layer was formed.

(Formation of Second Electrode (Cathode) and Sealing Layer)

Utilizing prepared band-form flexible supports Nos. 1-1-1-6, which bears up to an emission layer, by use of a manufacturing apparatus shown in FIG. 3, an electron injection layer, a cathode and a sealing layer were successively formed to prepare organic EL elements which were defined as sample Nos. 101-106.

(Formation of Second Electrode)

The external connection terminal forming portion for formation of the external connection terminal of a first electrode was covered with a mask, a LiF layer having a thickness of 0.5 mm being stripe-wise evaporated on a region of the formed emission layer under vacuum of $5 \times 10^{-4}$ Pa to form an electron injection layer, and further an aluminum layer having a thickness of 100 nm was evaporated on the electron injection layer so as to be perpendicular to a first electrode, whereby a second electrode was formed.

(Formation of Sealing Layer)

SiO$_x$ having a thickness of 300 nm was stripe-wise evaporated by a sputtering method under vacuum of $5 \times 10^{-4}$ Pa on the formed electrode except a region to be a connection terminal, whereby a sealing layer was formed.

(Evaluation)

Prepared each sample No. 101-106 was cut in a cutting process shown in FIG. 8 to prepare an individual organic EL element; emission unevenness was tested according to the following test method and the edge portion of an emitting region was observed according to an observation method shown below; the evaluation results based on the following evaluation ranks are shown in table 2.

Test Method of Emission Unevenness 50 sheets were randomly sampled among individual organic EL elements cut from each samples Nos. 101-106, and were made to emit by applying a direct current voltage on an organic EL element by use of Source Major Unit manufactured by Keithley Corp. With respect to the emission elements emitted at 200 cd, emission unevenness was observed through a microscope at a magnification of 50 times.

Evaluation Rank of Emission Unevenness

A: Not less than 95% among 50 sheets uniformly emits in not less than 80% of an emitted region.

B: Not less than 75% and less than 95% among 50 sheets uniformly emits in not less than 80% of an emitted region.

C: Not less than 55% and less than 75% among 50 sheets uniformly emits in not less than 80% of an emitted region.

D: Not less than 0% and less than 50% among 50 sheets uniformly emits in not less than 80% of an emitted region.

Observation Method of Edge Portion of Emission Region 50 sheets were randomly sampled among individual organic EL elements cut from each samples Nos. 101-106, and were made to emit by applying a direct current voltage on an organic EL element by use of Source Major Unit manufactured by Keithley Corp. With respect to the emission elements emitted at 200 cd, the edge portion of an emitted region was observed through a microscope at a magnification of 50 times.

Evaluation Rank of Edge Portion of Emitted Region

A: Not less than 95% among 50 sheets clearly display the edge portion of an emitted region.

B: Not less than 75% and less than 95% among 50 sheets clearly display the edge portion of an emitted region.

C: Not less than 50% and less than 75% among 50 sheets clearly display the edge portion of an emitted region.

D: Not less than 0% and less than 50% among 50 sheets clearly display the edge portion of an emitted region.

TABLE 2

| Sample No. | Masking member No. | Band-form flexible support No. bearing up to emission layer | Emission unevenness | Edge portion of emitted region | Remarks |
| --- | --- | --- | --- | --- | --- |
| 101 | 1-a | 1-1 | B | D | Comparison |
| 102 | 1-b | 1-2 | B | B | Invention |
| 103 | 1-c | 1-3 | A | A | Invention |
| 104 | 1-d | 1-4 | A | A | Invention |
| 105 | 1-e | 1-5 | B | B | Invention |
| 106 | 1-f | 1-6 | D | D | Comparison |

In sample No. 101, film formation resulted in a state that either a hole transport layer or an emission layer penetrated to be forced out from an effective pixel region due to insufficient adhesion force of a masking member, resulting in an inferior edge portion of an emitted region being observed. In sample No. 106, peeling-off stress increased at the time of peeling off the masking member due to large adhesion force of a masking member resulting in observation of emission unevenness and an inferior edge portion of an emitted region possibly accompanied to peeling-off of an organic layer from a first electrode which will be an effective region. The effects of this invention have been confirmed.

Example 2

Preparation of Band-Form Flexible Support Bearing First Electrode

By utilizing a band-form flexible support similar to example 1, a transparent gas barrier layer and a first electrode were formed under the same condition, whereby a band-form flexible support bearing a first electrode identical with that of example 1 was prepared.

(Preparation of Masking Member)

Polyester film having a thickness of 25 µm as a substrate and silicone type resin as an adhesive were utilized, and masking members of 100 m each varying adhesive strength were prepared to be Nos. 2-a-2-f. Herein, adhesive strength indicates a value measured based on a measurement of adhesion force defined by JIS Z-0237 adhesive tape-adhesive sheet test method. Variation of adhesion force was made by varying the composition of an adhesive layer. Herein, the width of a masking member was 25 mm.

TABLE 3

| Masking member No. | Adhesive strength (N/25 mm) |
| --- | --- |
| 2-a | 0.8 |
| 2-b | 1.0 |
| 2-c | 4.2 |
| 2-d | 6.9 |
| 2-e | 10.0 |
| 2-f | 11.8 |

(Lamination of Masking Member and Formation of Organic Compound Layer)

By use of a manufacturing apparatus shown in FIG. 2, the prepared masking member Nos. 2-a-2-a were laminated on the intervals of each first electrode of a band-form flexible support bearing a first electrode prepared in a state shown in FIG. 4; a hole transport layer forming coating solution was coated dried under the same condition as example 1; an emission layer forming coating solution was coated-dried under the same condition as example 1; a masking member was removed by peeling off to prepare a band-form flexible supported bearing up to an emission layer; the resulting supports were subjected to a charge neutralization treatment and cooled down to the same temperature as room temperature; followed by being wound on a core to be a roll form to prepare Nos. 2-1-2-6.

<Formation of Second Electrode (Cathode) and Sealing Layer>

Utilizing prepared band-form flexible supports Nos. 2-1-2-6, on which up to an emission layer had been formed, by use of a manufacturing apparatus shown in FIG. 2, a second electrode (a cathode) and a sealing layer were successively formed according to the following method to prepare organic EL elements which were defined as Nos. 201-206. Herein, after a second electrode (a cathode) had been formed, the samples were wound to make a roll form and once stored in an inert gas atmosphere.

(Formation of Second Electrode (Cathode))

The external connection terminal forming portion for formation of the external connection terminal of a first electrode was covered with a mask, a LiF layer having a thickness of 0.5 mm being stripe-wise evaporated on a region of the formed emission layer under vacuum of $5\times10^{-4}$ Pa to form an electron injection layer, and further an aluminum layer having a thickness of 100 nm was evaporated on the electron injection layer so as to be perpendicular to a first electrode, whereby a second electrode (a cathode) was formed.

(Formation of Sealing Layer by Lamination of Flexible Sealing Member)

By use of an apparatus shown in FIG. 6, a roll-form flexible support bearing up to a second electrode (a cathode) was unwound out, ultraviolet curable epoxy resin (XNR5570-B1, manufactured by Nagase Chemtex Co., Ltd.) as an adhesive being coated by a gravure printing method except on the external connection terminal forming portion (a first electrode and a second electrode) for formation of an external connection terminal, a flexible sealing member having the same width as the band-form flexible support being pressing adhered, then the resulting sample was irradiated with an UV lamp from a second electrode (a cathode) side to conduct adhesion of the flexible sealing member. Thereafter, by use of a die-cutter shown in FIG. 7, die-cutting was conducted to remove the unnecessary flexible sealing member, whereby the portion laminated on the emission region of an organic EL element on a band-form flexible support was removed and the unnecessary portion of a band-form flexible sealing member was removed by being wound up.

Herein, epoxy resin as an adhesive may be a heat curable type. In this case, heating press is conducted by being passed through between heat rollers at the time of lamination. Further, an adhesive may be applied by means of dispenser or screen printing only on the circumference of an emission part region.

As a flexible sealing member, PET having a thickness of 100 μm as a substrate on which silicon oxide had been formed by evaporation at a thickness of 500 nm as a barrier layer, was utilized as a sealing film.

(Evaluation)

With respect to each of sample Nos. 201-206, individual organic EL element was prepared by cutting in a cutting process shown in FIG. 8 similar to example 1, and emission unevenness and the edge portion of an emitted region were tested in the same test method as example 1, whereby the results evaluated based on evaluation ranks same as example 1 are shown in table 4.

TABLE 4

| Sample No. | Masking member No. | Band-form flexible support No. bearing up to emission layer | Emission unevenness | Edge portion of emitted region | Remarks |
| --- | --- | --- | --- | --- | --- |
| 201 | 2-a | 2-1 | D | B | Comparison |
| 202 | 2-b | 2-2 | B | B | Invention |
| 203 | 2-c | 2-3 | A | A | Invention |
| 204 | 2-d | 2-4 | A | A | Invention |
| 205 | 2-e | 2-5 | B | B | Invention |
| 206 | 2-f | 2-6 | D | D | Comparison |

In sample No. 201, film formation resulted in a state that either a hole transport layer or an emission layer was forced out from an effective pixel region due to insufficient adhesion force of a masking member, resulting in observation of an inferior edge portion of an emitted region. In sample No. 206, peeling-off stress increased at the time of peeling off the masking member due to large adhesion force of a masking member resulting in observation of emission unevenness and an inferior edge portion of an emitted region possibly accompanied to peeling-off of an organic layer from a first electrode which will be an effective region. The effects of this invention have been confirmed.

The organic EL elements of these examples 1 and 2 exhibit green emission, however, a white emission organic EL element can be prepared by appropriately mixing Ir(ppy)$_3$, FIr(pic) and btp$_2$Ir(acac). This can be applied for an illumination, and this invention can provide an illumination manufacturing apparatus having a high productivity at a low cost such as a roll-to-roll type.

What is claimed is:

1. A method of producing an organic electroluminescent element comprising a substrate having thereon:
   a first electrode;
   an organic compound layer;
   a second electrode; and
   a sealing layer,
   the method comprising the steps of:
   supplying the substrate from a first roll core upon which the substrate had been wound;
   supplying a masking member from a second roll core upon which the masking member had been wound;
   laminating the masking member onto a region of the substrate on which the organic compound layer is prevented from forming, provided that the masking member has an adhesion force of from 4.1 to 6.5 N/25 mm;
   forming the organic compound layer on the substrate; and
   separating the masking member from the masked substrate on which the first electrode and organic compound layer have been formed.

2. The method of producing an organic electroluminescent element of claim 1,
   after the step of separating the masking member,
   further comprising a step of cutting off the organic electroluminescent element formed on the substrate.

3. The method of producing an organic electroluminescent element of claim 1,
   wherein the region of the substrate on which the organic compound layer is prevented from forming is a region on which forms an external connection terminal for the first electrode layer.

4. The method of producing an organic electroluminescent element of claim 1,
   the method comprises the steps of:
   forming on a surface of the substrate any one of the first electrode, the organic compound layer including a light-emitting layer, the second electrode and the sealing layer; and
   storing the substrate formed thereon any one of the first electrode, the organic compound layer including a light-emitting layer, the second electrode and the sealing layer in a roll shape wound on a second roll core.

5. The method of producing an organic electroluminescent element of claim 1,
   wherein the masking member is a flexible material comprising a mask substrate having thereon a sealant layer.

6. The method of producing an organic electroluminescent element of claim 1,
   wherein the laminating step of the masking member is carried out using a pressing adhesion method.

7. The method of producing an organic electroluminescent element of claim 1,
wherein the organic compound layer comprises a light emitting layer forming material.

8. The method of producing an organic electroluminescent element of claim 7,
wherein the light emitting layer forming material emits light via a light emitting mechanism of phosphorescence.

9. The method of producing an organic electroluminescent element of claim 1,
wherein the masking member is selected from the group consisting of:
(i) a mask substrate provided with an adhesive on one surface of the mask substrate;
(ii) a mask substrate provided with a sealant on one surface of the mask substrate; and
(iii) a thermoplastic resin film.

10. The method of producing an organic electroluminescent element of claim 9,
wherein the adhesive on one surface of the mask substrate or the sealant on one surface of the mask substrate is peeled off with the mask substrate in the step of separating the masking member.

11. A method of producing an organic electroluminescent element comprising a substrate having thereon:
a first electrode;
an organic compound layer;
a second electrode; and
a sealing layer,
the method comprising the sequential steps of:
forming the first electrode on the substrate;
supplying the substrate from a first roll core upon which the substrate had been wound;
supplying a masking member from a second roll core upon which the masking member had been wound;
laminating the masking member onto a region of the substrate on which the organic compound layer is prevented from forming, provided that the masking member has an adhesion force of from 4.1 to 6.6 N/25 mm;
forming the organic layer compound on the entire surface of the masked substrate;
forming the second electrode;
forming the sealing layer; and
separating the masking member from the masked substrate on which the first electrode and organic compound layer have been formed.

12. The method of producing an organic electroluminescent element of claim 11,
after the step of separating the masking member, further comprising the step of:
cutting off the organic electroluminescent element formed on the substrate.

13. A method of producing an organic electroluminescent element comprising the sequential steps of:
forming a first electrode on a substrate;
forming an organic compound layer including a light-emitting layer;
forming a second electrode; and
forming a sealing layer,
wherein the step of forming the organic compound layer comprises the steps of:
supplying the substrate from a first roll core upon which the substrate had been wound;
supplying a masking member from a second roll core upon which the masking member had been wound;
laminating the masking member onto a region of the substrate on which the organic compound layer is prohibited from forming, provided that the masking member has an adhesive force of from 4.1 to 6.6 N/25 mm;
forming the organic compound layer on the substrate;
separating the masking member from the masked substrate on which the first electrode and organic compound layer has been formed.

14. The method of producing an organic electroluminescent element of claim 13,
after the step of forming the sealing layer, further comprising the step of:
cutting off the organic electroluminescent element.

* * * * *